United States Patent
Lee et al.

(10) Patent No.: US 10,553,291 B2
(45) Date of Patent: Feb. 4, 2020

(54) NONVOLATILE MEMORY DEVICE AND OPERATING METHOD THEREOF

(71) Applicant: Samsung Electronics Co., Ltd., Suwon-si, Gyeonggi-do (KR)

(72) Inventors: Jae-yun Lee, Anyang-si (KR); Il-han Park, Suwon-si (KR); Jun-yong Park, Seoul (KR); Byung-soo Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 33 days.

(21) Appl. No.: 16/015,959

(22) Filed: Jun. 22, 2018

(65) Prior Publication Data
US 2019/0392908 A1 Dec. 26, 2019

(30) Foreign Application Priority Data

Nov. 14, 2017 (KR) ........................ 10-2017-0151726

(51) Int. Cl.
| | |
|---|---|
| *G11C 16/04* | (2006.01) |
| *G11C 16/34* | (2006.01) |
| *G11C 16/10* | (2006.01) |
| *G11C 16/08* | (2006.01) |
| *G11C 11/56* | (2006.01) |
| *H01L 27/11582* | (2017.01) |

(52) U.S. Cl.
CPC ...... *G11C 16/3422* (2013.01); *G11C 16/0466* (2013.01); *G11C 16/0483* (2013.01); *G11C 16/08* (2013.01); *G11C 16/10* (2013.01); *G11C 16/349* (2013.01); *G11C 16/3459* (2013.01); *G11C 11/5671* (2013.01); *G11C 2211/5621* (2013.01); *G11C 2211/5644* (2013.01); *H01L 27/11582* (2013.01)

(58) Field of Classification Search
CPC ............ G11C 16/3422; G11C 16/0466; G11C 16/0483; G11C 16/08
USPC .................................................. 365/185.22
See application file for complete search history.

(56) References Cited

U.S. PATENT DOCUMENTS

| | | |
|---|---|---|
| 6,279,070 B1 | 8/2001 | Jeong et al. |
| 6,469,933 B2 | 10/2002 | Choi et al. |
| 7,679,133 B2 | 3/2010 | Son et al. |

(Continued)

FOREIGN PATENT DOCUMENTS

KR    10-1021701 B1    3/2011

*Primary Examiner* — Vu A Le
(74) *Attorney, Agent, or Firm* — Harness, Dickey & Pierce, P.L.C.

(57) ABSTRACT

Provided is a nonvolatile memory device and an operating method thereof. The operating method for programming a first memory block from among a plurality of memory blocks includes: programming a first word line connected to the first memory block by sequentially executing first to $N^{th}$ (N is a natural number) programming loops; applying a voltage generated by regulating a first pump voltage of a first charge pump to the first word line as a dummy verifying voltage after the programming is completed; generating a first detection count based on the first pump voltage and a first reference voltage; and outputting a bad block setting signal for setting the first memory block as a bad block based on a result of comparing the first detection count with the first reference count.

20 Claims, 16 Drawing Sheets

(56) References Cited

U.S. PATENT DOCUMENTS

| | | |
|---|---|---|
| 7,688,631 B2 | 3/2010 | Kim et al. |
| 7,697,327 B2 | 4/2010 | Kim et al. |
| 7,885,091 B2 | 2/2011 | Mihnea et al. |
| 8,248,852 B2 | 8/2012 | Kim et al. |
| 8,432,744 B2 | 4/2013 | Umezawa et al. |
| 8,488,381 B2 | 7/2013 | Kim et al. |
| 8,553,466 B2 | 10/2013 | Han et al. |
| 8,559,229 B2 | 10/2013 | Kim et al. |
| 8,559,235 B2 | 10/2013 | Yoon et al. |
| 8,654,587 B2 | 2/2014 | Yoon et al. |
| 9,189,174 B2 | 11/2015 | Lee et al. |
| 9,418,751 B1 | 8/2016 | Dutta et al. |
| 9,449,698 B1 | 9/2016 | Paudel et al. |
| 9,698,676 B1 | 7/2017 | Huynh et al. |
| 9,711,231 B1 | 7/2017 | Yip et al. |
| 2011/0233648 A1 | 9/2011 | Seol et al. |
| 2014/0084936 A1 | 3/2014 | Pan et al. |
| 2014/0334232 A1 | 11/2014 | Nam et al. |
| 2016/0246672 A1* | 8/2016 | Yang .................. G06F 11/1068 |
| 2018/0286492 A1* | 10/2018 | Lee ....................... G11O 29/44 |

\* cited by examiner

NONVOLATILE MEMORY DEVICE AND OPERATING METHOD THEREOF

CROSS-REFERENCE TO RELATED APPLICATION

This U. S. non-provisional application claims the benefit of priority to Korean Patent Application No. 10-2017-0151726, filed on Nov. 14, 2017, in the Korean Intellectual Property Office, the disclosure of which is incorporated herein in its entirety by reference.

BACKGROUND

Various example embodiments of the inventive concepts relate to a nonvolatile memory device, a method of operating the nonvolatile memory device, a non-transitory computer readable medium storing computer readable instructions for operating the nonvolatile memory device, and/or a system for operating the nonvolatile memory device. More particularly, various example embodiments relate to a nonvolatile memory device capable of detecting a bad block.

A semiconductor memory device includes a memory device implemented using semiconductors, such as silicon (Si), germanium (Ge), gallium arsenide (GaAs), or indium phosphide (InP), etc. Semiconductor memory devices may be divided into volatile memory devices and nonvolatile memory devices.

A nonvolatile memory device retains data stored therein even if power supply is interrupted. Examples of nonvolatile memory devices include read-only memory (ROM), programmable ROM (PROM), electrically programmable ROM (EPROM), electrically erasable programmable ROM (EEPROM), a flash memory device, phase-change random-access memory (PRAM), magnetic RAM (MRAM), resistive RAM (RRAM), and ferroelectric RAM (FRAM), etc. The flash memory may be of a NOR type and a NAND type.

SUMMARY

Various example embodiments of the inventive concepts provide a nonvolatile memory device capable of detecting an uncorrectable error correcting code (UECC), an operating method thereof, a non-transitory computer readable medium storing computer readable instructions for operating the nonvolatile memory device, and/or a system including the nonvolatile memory device.

According to an aspect of at least one example embodiment of the inventive concepts, there is provided an operating method of a nonvolatile memory device for programming a first memory block from among a plurality of memory blocks, the operating method including: programming, using a control logic circuit, a first word line connected to the first memory block by sequentially executing first to $N^{th}$ (N is a natural number) programming loops on the first memory block, applying, using the control logic circuit, a dummy verifying voltage generated by regulating a first pump voltage of a first charge pump to the first word line, generating, using the control logic circuit, a first detection count based on the first pump voltage and a first reference voltage, and outputting, using the control logic circuit, a bad block setting signal for setting the first memory block as a bad block based on the first detection count and a first reference count.

According to another aspect of at least one example embodiment of the inventive concepts, there is provided a memory cell array including: a first memory block connected to a plurality of word lines; and control logic circuitry configured to, output a voltage generated by regulating a first pump voltage to a first word line as a dummy verifying voltage after completing a programming operation for the first word line, the plurality of word lines including the first word line, generate a first detection clock based on the first pump voltage and a first reference voltage, and output a bad block setting signal for setting the first memory block as a bad block based on the first detection clock and a first reference detection count.

According to another aspect of at least one example embodiment of the inventive concepts, there is provided an operating method of a nonvolatile memory device for programming a first memory block from among a plurality of memory blocks, the operating method including: programming, using a control logic circuit, a first word line connected to the first memory block by sequentially executing first to $N^{th}$ (N is a natural number) programming loops, applying, using the control logic circuit, a first voltage generated by regulating a first pump voltage having a voltage level less than zero of a charge pump to the first word line after the programming is completed, generating, using the control logic circuit, a first detection count based on the first pump voltage and a first reference voltage, and setting, using the control logic circuit, the first memory block as a bad block based on the first detection count and a first reference count, wherein the first detection count is proportional to an amount of charges flowing into the first word line.

BRIEF DESCRIPTION OF THE DRAWINGS

Various example embodiments of the inventive concepts will be more clearly understood from the following detailed description taken in conjunction with the accompanying drawings in which.

DETAILED DESCRIPTION

Figure 1:
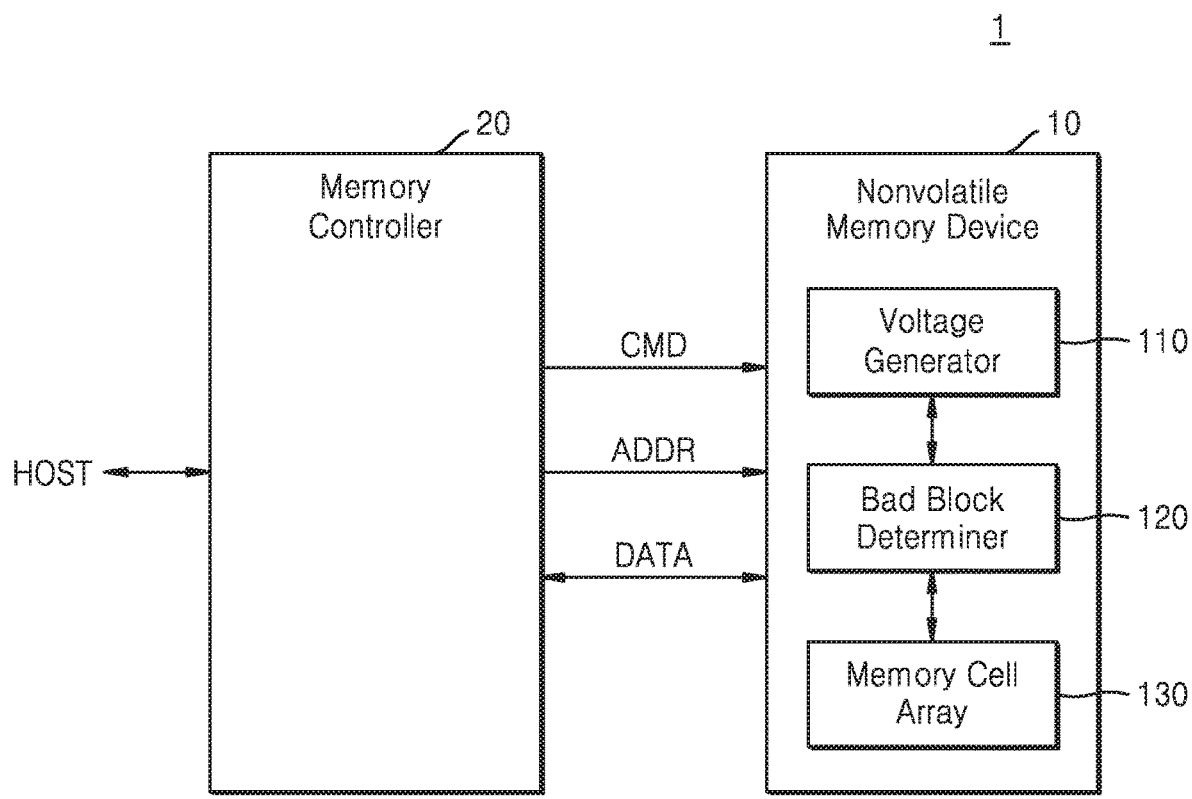
FIG. 1 is a block diagram of a nonvolatile memory system according to at least one example embodiment of the inventive concepts.

FIG. 1 is a block diagram of a nonvolatile memory system 1 according to at least one example embodiment of the inventive concepts.

Referring to FIG. 1, the nonvolatile memory system 1 may be a workstation, a net-book, a personal digital assistant (PDA), a portable computer, a web tablet, a wireless phone, a mobile phone, a smart phone, an e-book, a portable multimedia player, a portable game player, a personal navigation device, a black box, a digital camera, a digital multimedia broadcasting (DMB) player, a digital audio recorder, a digital audio player, a digital picture recorder, a digital picture player, a digital video recorder, a digital video player, a wearable smart device, a virtual reality device, an augmented reality device, or the like.

The nonvolatile memory system 1 may include a memory controller 20 and a nonvolatile memory device 10, but is not limited thereto. In at least one example embodiment, each of the memory controller 20 and the nonvolatile memory device 10 may be provided as one chip, one package, one module, or the like. Additionally, the memory controller 20 and the nonvolatile memory device 10 may be mounted using packages such as a package on package (PoP), ball grid arrays (BGAs), chip scale packages (CSPs), plastic leaded chip carriers (PLCC), plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), small outline carriers (SOIC), a shrink small outline package (SSOP), a thin small outline package (TSOP), a thin quad flat pack (TQFP), a system in package (SIP), a multi-chip package (MCP), a wafer-level fabricated package (WFP), a wafer-level processed stack package (WSP), or the like.

The memory controller 20 may control the nonvolatile memory device 10 in response to a program request, a write request, and/or a read request received from the host HOST. For example, the memory controller 20 may transmit a programming command CMD and an address ADDR to the nonvolatile memory device 10 in response to the program request received from the host HOST. The address ADDR that the memory controller 20 transmits to the nonvolatile memory device 10 may be a physical address of the nonvolatile memory device 10. The memory controller 20 may exchange data DATA with the nonvolatile memory device 10.

The nonvolatile memory device 10 may perform operations, such as a programming operation (e.g., a write operation), a reading operation, an erasing operation, etc., in response to signals received from the memory controller 20.

When the nonvolatile memory device 10 programs memory cells in response to the received signals from the memory controller 20, a programming voltage and a verifying voltage may be provided to a word line according to an incremental step pulse programming (hereinafter ISPP) method, but the example embodiments are not limited thereto. Both the programming voltage and the verifying voltage may be provided to the word line according to, for example, the ISPP method. In a programming operation according to the ISPP method, for example, application of programming pulses and application of verifying pulses may be performed in one programming loop, but the example embodiments are not limited thereto. Memory cells selected through a plurality of programming loops may be programmed in a target state. Hereinafter, in the programming operation, the nonvolatile memory device 10 may apply a programming voltage to a memory cell selected in one programming loop, and in a verifying operation, the nonvolatile memory device 10 may apply a verifying voltage to a memory cell selected in one of the programming loops. In addition, 'a programming operation for a word line' described later below may indicate 'a programming operation for a memory cell connected to a word line'.

According to at least one example embodiment, the nonvolatile memory device 10 may include a voltage generator 110, a bad block determiner 120, and/or a memory cell array 130, but the example embodiments are not limited thereto. The voltage generator 110 may generate various kinds of voltages for performing writing, reading, and erasing operations on the memory cell array 130 based on a voltage control signal. In more detail, the voltage generator 110 may generate a word-line voltage, for example, a programming voltage (or a write voltage), a read voltage, a pass voltage (or a word line non-selection voltage), and/or a verifying voltage, etc. In addition, in the programming operation according to the ISPP method, the voltage generator 110 may generate a plurality of programming voltages and a plurality of verifying voltages having different voltage levels. According to at least one example embodiment of the inventive concepts, the voltage generator 110 may apply an additional verifying voltage to the memory cell array 130 after the programming operation is completed. In at least one example embodiment of the inventive concepts, such a verifying voltage is referred to as a dummy verifying voltage. In at least one example embodiment of the inventive concepts, the dummy verifying voltage may be a negative voltage.

The bad block determiner 120 may set at least one memory block included in the memory cell array 130 as a bad block (e.g., a memory block that exhibits an uncorrectable error, cannot maintain the correct bit value, cannot maintain the correct charge, etc.) based on at least one voltage generated by the voltage generator 110. According to at least one example embodiment of the inventive concepts, the bad block determiner 120 may compare a reference voltage level with a pump voltage level of a charge pump included in the voltage generator 110, and may detect an interval in which the pump voltage level of the charge pump is less than the reference voltage level to determine whether a memory block connected to the charge pump is a bad block. In at least one example embodiment of the inventive concepts, the detecting operation may be an operation for determining whether a memory block connected to the charge pump is a bad block by calculating the amount of output current of the charge pump. Detailed operations will be described later below with reference to FIGS. 7 to 11B.

The memory cell array 130 may include a plurality of memory cells. For example, the plurality of memory cells may be flash memory cells, but the example embodiments are not limited thereto. Hereinafter, example embodiments will be described in detail based on a case where the plurality of memory cells are NAND flash memory cells. However, the example embodiments of the inventive concepts are not limited thereto, and in other example embodiments, the plurality of memory cells may be resistive memory cells such as resistive RAM (RRAM), phase change RAM (PRAM), magnetic RAM (MRAM), etc.

According to some example embodiments, the memory cell array 130 may be a three-dimensional (3D) memory cell array. The 3D memory cell array is a circuit for operations of memory cells and includes an active region on a silicon substrate. In the 3D memory cell array, memory cell arrays having circuits formed on or in the silicon substrate are monolithically formed at one or more physical levels. The term "monolithic" means that layers at each level constituting the arrays are stacked directly on layers at a lower level of the arrays. The 3D memory cell array also includes NAND strings arranged in a vertical direction such that at least one memory cell is on another memory cell. The at least one memory cell may include a charge trap layer. However, the example embodiments of the inventive concepts are not limited thereto, and in other example embodiments, the memory cell array 130 may be, for example, a two-dimensional (2D) memory cell array, etc.

U.S. Pat. Nos. 7,679,133, 8,553,466, 8,654,587, 8,559,235, and U.S. Patent Application Publication No. 2011-0233648, which are incorporated herein by reference in their entireties, describe suitable configurations for a 3D memory array including multiple levels and in which word lines and/or bit lines are shared between the levels. Furthermore, U.S. Patent Application Publication No. 2014-0334232 and U.S. Pat. No. 8,488,381 are incorporated herein by reference in their entireties.

As the number of layers stacked in the 3D memory cell array is increased, a lower gate layer may become thinner. Thus, a word line bridging phenomenon is generated, and accordingly, a short circuit occurs between word lines as the insulating layer separating the word lines is destroyed. Data stored in memory cells connected to a lower word line may be lost due to the word line bridging phenomenon. The nonvolatile memory device 10 according to at least one example embodiment of the inventive concepts may decrease and/or prevent the data from being lost by detecting the amount of current applied from the voltage generator 110 to a word line, predicting whether at least one memory block included in the memory cell array 130 is a bad block based on a detection result, and setting at least one memory block as a bad block, thereby causing the memory controller 20, host, etc., to use a different and/or replacement memory block in the place of the bad block.

In at least one example embodiment, each memory cell included in the memory cell array 130 may be a multi-level cell (MLC) for storing two or more bits of data. For example, the memory cell may be an MLC storing 2-bit data. As another example, the memory cell may be a triple-level cell (TLC) for storing 3-bit data or a quadruple-level cell (QLC) for storing 4-bit data. However, the example embodiments of the inventive concepts are not limited thereto. In another example embodiment, some memory cells included in the memory cell array 130 may be single level cells (SLC) for storing 1-bit data, and the other memory cells may be MLCs, etc.

Figure 2:
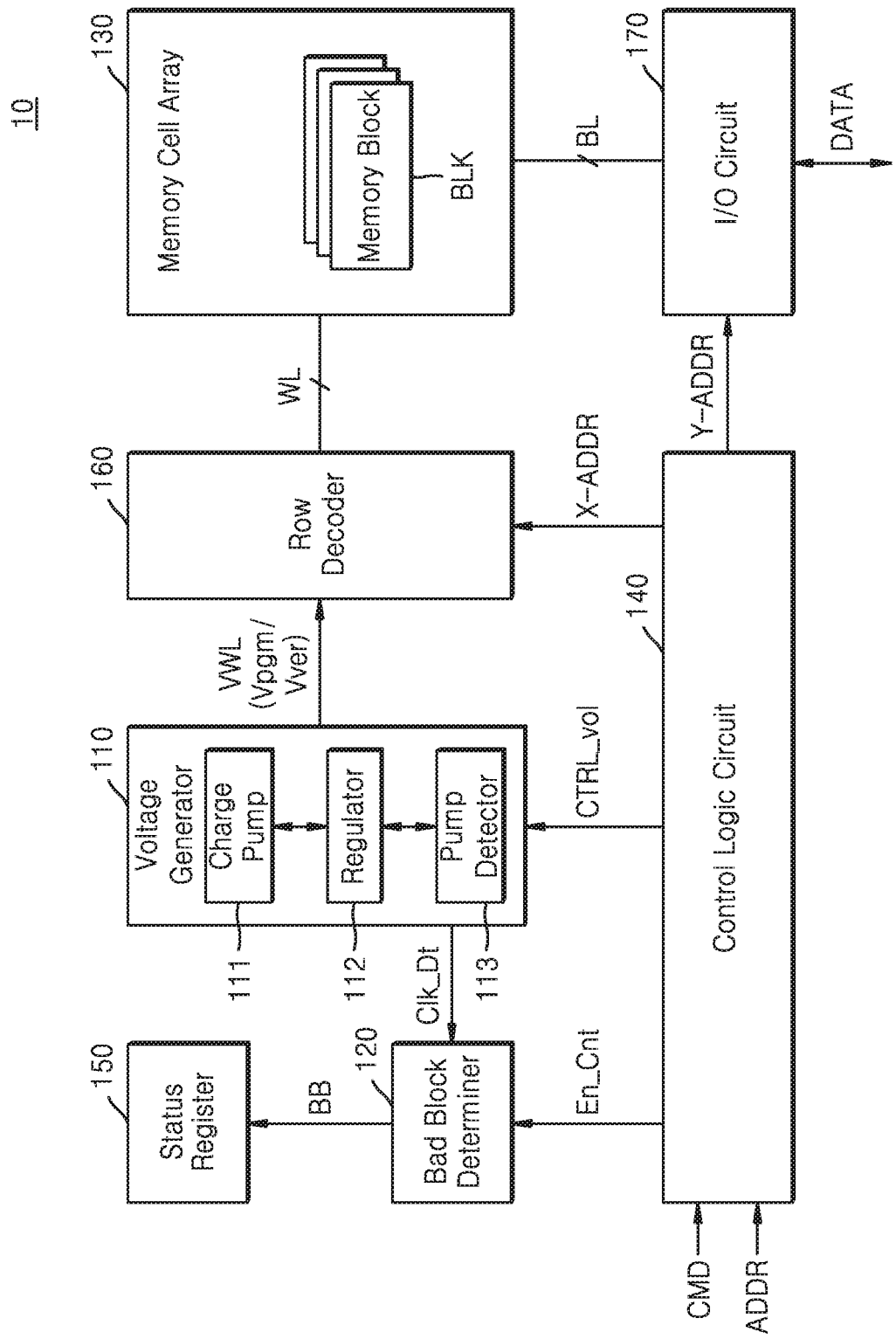
FIG. 2 is a block diagram of a nonvolatile memory device according to at least one an example embodiment of the inventive concepts.

FIG. 2 is a block diagram of the nonvolatile memory device 10 according to at least one example embodiment of the inventive concepts. In FIG. 2, the same reference numerals as in FIG. 1 denote the same elements, and therefore, repeated descriptions thereof will not be given herein.

Referring to FIG. 2, the nonvolatile memory device 10 may include the voltage generator 110, the bad block determiner 120, the memory cell array 130, a control logic circuit 140, a status register 150, a row decoder 160, and/or an input/output circuit 170, etc., but the example embodiments are not limited thereto.

The voltage generator 110 may receive a voltage control signal CTRL_vol from the control logic circuit 140 (e.g., a controller, etc.) and generate at least one word-line voltage VWL based thereon. The word-line voltage VWL may include a plurality of voltage types, such as a programming voltage Vpgm, a verifying voltage Vver, etc. The voltage generator 110 may output the generated word-line voltage VWL to a word line WL through the row decoder 160.

According to some example embodiments, the voltage generator 110 may include a charge pump 111, a regulator 112, and/or a pump detector 113, etc., but the example embodiments are not limited thereto. The charge pump 111 may generate a pump voltage for generating the word-line voltage VWL required for a programming operation. The pump voltage may be either a positive voltage having a voltage level greater than zero (in comparison to ground, a reference voltage, a desired threshold voltage, etc.) or a negative voltage that is less than zero (in comparison to ground, a reference voltage, a desired threshold voltage, etc.). The regulator 112 may generate the at least one word-line voltage VWL by regulating the pump voltage generated by the charge pump 111. The regulator 112 may output the at least one generated word-line voltage VWL to the row decoder 160.

The pump detector 113 may generate a detection signal by comparing the pump voltage of the charge pump 111 with a reference voltage and output a detection clock CLK_DT to the bad block determiner 120 based on the detection signal. In at least one example embodiment, the pump detector 113 may output a clock (e.g., clock signal) for an interval in which magnitude of the pump voltage is less than the magnitude of the reference voltage to the bad block determiner 120 as the detection clock CLK_DT. In at least one example embodiment, when the pump voltage is a negative voltage, the pump detector 113 may output a clock (e.g., clock signal) for an interval in which the pump voltage is higher than the reference voltage having a voltage level less than zero to the bad block determiner 120 as the detection clock CLK_DT. In another example embodiment, when the pump voltage is a positive voltage, the pump detector 113 may output a clock (e.g., clock signal) for an interval in which the pump voltage is lower than the reference voltage having a voltage level greater than zero to the bad block determiner 120 as the detection clock CLK_DT.

According to some example embodiments, the magnitude of the pump voltage of the charge pump 111 may have different upward slopes depending on the amount of charges flowing into a word line, and may further have a more gradual upward slope because the amount of charges flowing into the word line increases when a word line bridge is generated. In at least one example embodiment, the charge may be positive, and in another example embodiment, the charge may be negative. Accordingly, when the word line bridge is generated, an interval in which the magnitude of the pump voltage of the charge pump 111 has a voltage level lower than that of the magnitude of the reference voltage may be prolonged. According to at least one example embodiment of the inventive concepts, it is possible to predict whether a word line bridge is generated or not by detecting this interval. This will be described later below with reference to FIGS. 11A and 11B.

The bad block determiner 120 may generate a detection count by receiving and counting the detection clock CLK_DT. According to at least one example embodiment of the inventive concepts, the bad block determiner 120 may receive a count-enable signal En_Cnt from the control logic circuit 140 and generate a detection count by counting only the detection clock CLK_DT received in an interval in which the count-enable signal En_Cnt is logic high. In at least one example embodiment, the count-enable signal En_Cnt may be output in an interval where a voltage level of the word line WL is stable, which will be described later with reference to FIGS. 11A and 11B.

The bad block determiner 120 may determine whether to set the memory block BLK as a bad block by comparing the detection count with a reference count (e.g., a desired threshold value, etc.). When the memory block BLK is set as a bad block, the bad block determiner 120 may output a bad block setting signal BB for the memory block BLK, for example, to the status register 150, but the example embodiments are not limited thereto.

The memory cell array 130 may be formed of planes including a plurality of memory blocks, and the plurality of memory blocks may include a plurality of pages. The plurality of pages may include a plurality of memory cells. The memory block BLK will be described later below in FIGS. 4 to 6.

According to at least one example embodiment, the control logic circuit 140 may output various control signals corresponding to various memory operations, such as control signals to write data to the memory cell array 130, to read data from the memory cell array 130, etc., based on various commands CMD and addresses ADDR received from the memory controller 20. In more detail, the control logic circuit 140 may output the voltage control signal CTRL_vol to the voltage generator 110 based on a command CMD, output a row address X-ADDR to the row decoder 160 based on the address ADDR, and output a column address Y-ADDR to the input/output circuit 170. Furthermore, the control logic circuit 140 may also output the count-enable signal En_Cnt to the bad block determiner 120. In at least one example embodiment, the count-enable signal En_Cnt may be output in an interval where a voltage level of the word line WL is stable.

The status register 150 may store information on whether a bad block is set for a plurality of memory blocks. To this end, the status register 150 may include at least one storage device. The status register 150 may receive the bad block setting signal BB from the bad block determiner 120 and set the corresponding memory block BLK as a bad block. In at least one example embodiment, the control logic circuit 140 may select the memory block BLK to be programmed based on information on the bad block setting stored in the status register 150 in response to a programming command to be subsequently received.

The row decoder 160 may select some of the word lines WL in response to receiving the row address X-ADDR. The row decoder 160 transfers a word-line voltage to the selected word line. For example, in a programming operation, the row decoder 160 may apply a programming voltage and a verifying voltage to the selected word line, and a program inhibit voltage to an unselected word line. In a read operation, the row decoder 160 may apply a read voltage to the selected word line and a read inhibit voltage to the unselected word line. In a recovery operation, the row decoder 160 may apply a recovery voltage to the selected word line. Also, the row decoder 160 may select some of string selection lines or some of ground selection lines in response to the row address X-ADDR.

The input/output circuit 170 may receive data from the outside (e.g., a memory controller) and store the input data in the memory cell array 130. Further, the input/output circuit 170 may read data from the memory cell array 130 and output the read data to the outside. The input/output circuit 170 may include page buffers (not shown) corresponding to bit lines BL. The page buffers may be connected to the memory cell array 130 through the bit lines BL, and may select some of the bit lines BL in response to the column address Y-ADDR received from the control logic circuit 140. Additionally, in the programming operation, the page buffer may function as a write driver to program the data DATA to be stored in the memory cell array 130.

Figure 3:
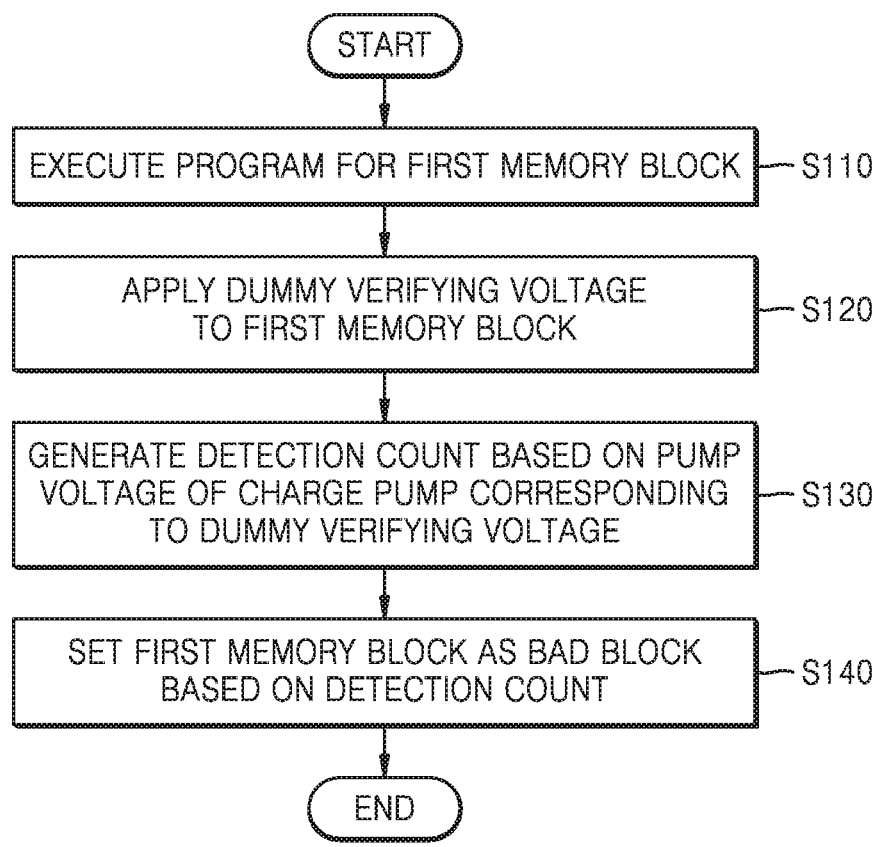
FIG. 3 is a flowchart of an operating method of a nonvolatile memory device, according to at least one example embodiment of the inventive concepts.

FIG. 3 is a flowchart of an operating method of the nonvolatile memory device 10, according to at least one example embodiment of the inventive concepts.

Referring to FIGS. 2 and 3, in operation S110, the nonvolatile memory device 10 may execute a program for a first memory block by applying a plurality of programming voltages and a plurality of verifying voltages to the word line WL connected to the first memory block. After the program for the first memory block is completed, in operation S120, the nonvolatile memory device 10 may additionally apply a dummy verifying voltage to the first memory block. In operation S130, the nonvolatile memory device 10 may generate a detection count based on the pump voltage of the charge pump 111 corresponding to the dummy verifying voltage. In at least one example embodiment, the nonvolatile memory device 10 may generate the detection clock CLK_DT by comparing the pump voltage of the charge pump 111 with the reference voltage, and may generate a detection count by counting the detection clock CLK_DT in an interval in which the count-enable signal En_Cnt is output, however the example embodiments are not limited thereto. In operation S140, the nonvolatile memory device 10 may set the first memory block as a bad block based on the generated detection count. In at least one example embodiment, the nonvolatile memory device 10 may determine whether to set the first memory block as a bad block by comparing the detection count with the reference count (e.g., a desired threshold value which may be set according to experiential test data collected from known bad blocks and/or sectors of nonvolatile memory devices, etc.). Additionally, according to at least one example embodiment, when the first memory block is determined to be a bad block, the first memory block may be set as a bad block by changing information (e.g., bad block information, etc.) on the bad block setting for the first memory block in the status register 150, however the example embodiments are not limited thereto. For example, according to other example embodiments, the bad block information may be set in a file allocation table (FAT), etc., of an operating system, a memory controller (e.g., a SCSI controller, a RAID controller, a bus controller, etc.).

Figure 4:
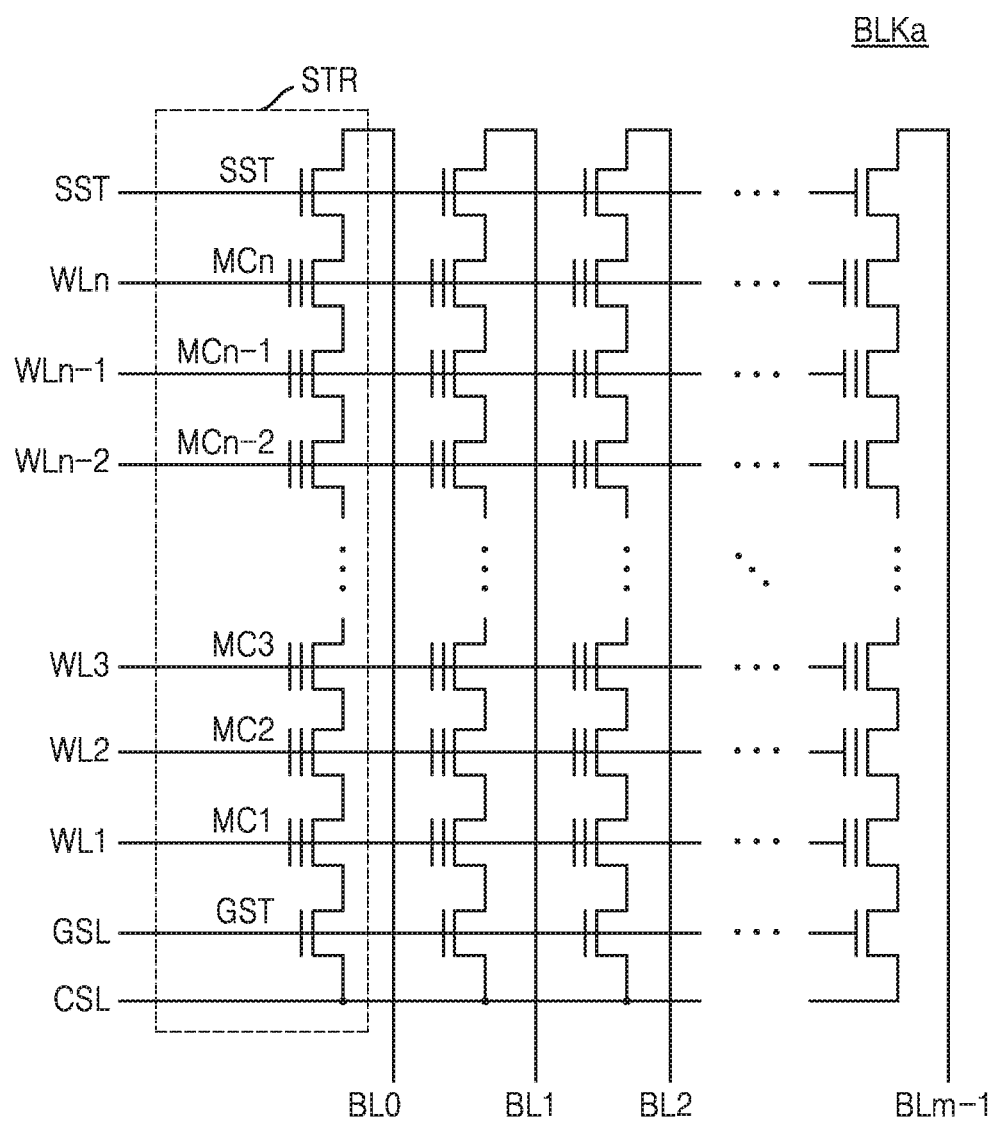
FIG. 4 is a circuit diagram of a memory block included in a memory cell array, according to at least one example embodiment of the inventive concepts.

FIG. 4 is a circuit diagram of a memory block included in a memory cell array, according to at least one example embodiment of the inventive concepts.

Referring to FIG. 4, for example, the memory cell array 130 (of FIG. 2) may be a memory cell array of a vertical NAND flash memory, and may include a plurality of memory blocks, however the example embodiments are not limited thereto. Each memory block BLKa may include m (m is an integer equal to or greater than 2) cell strings STR in which a plurality of memory cells MC are connected in series in a direction of bit lines BL0 to BLm−1. FIG. 4 shows an example in which each of the cell strings STR includes n memory cells.

A NAND flash memory device having the structure shown in FIG. 4 is erased on a block basis (e.g., the memory cells of the NAND flash memory device are erased on a block basis) and executes a program in page units corresponding to each of word lines WL1 to WLn. FIG. 4 shows an example in which n pages for n word lines WL1 to WLn are provided in one block. The nonvolatile memory device 10 may drive a selected word line connected to a memory cell to be programmed during a programming operation and a verifying operation. In at least one example embodiment, when performing a program for a third memory cell MC3, a third word line WL3 may be the selected word line. The nonvolatile memory device 10 of FIGS. 1 and 2 may include a plurality of memory cell arrays performing the same operation as that of the memory cell array 130 described above with the same structure as that of the memory cell array 130, but are not limited thereto.

Figure 5:
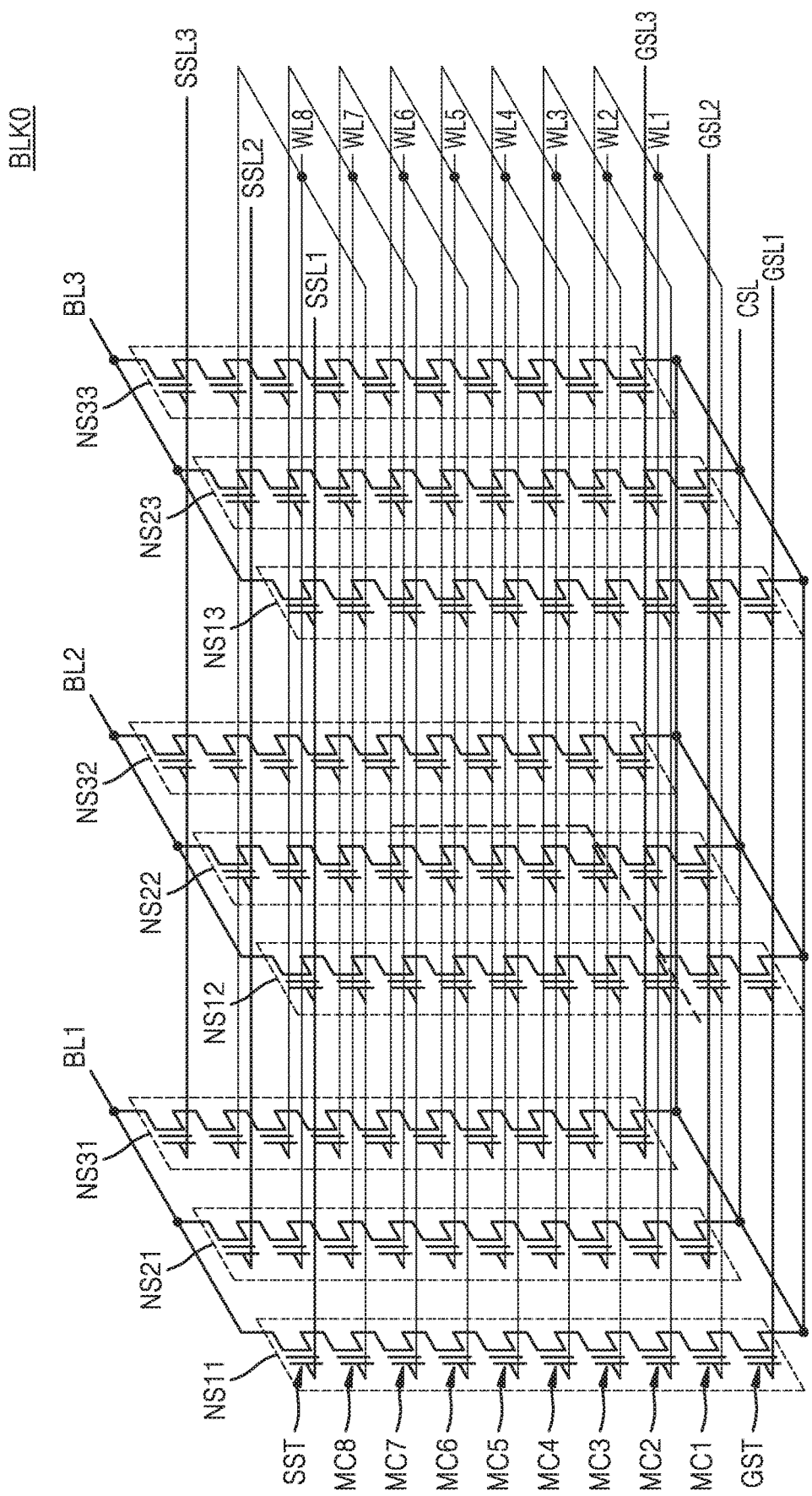
FIG. 5 is a circuit diagram of another example of a memory block included in a memory cell array, according to at least one example embodiment of the inventive concepts.

FIG. 5 is a circuit diagram of another example of a memory block included in a memory cell array, according to at least one example embodiment of the inventive concepts.

Referring to FIG. 5, for example, the memory cell array 130 (of FIG. 2) may be a memory cell array of a vertical NAND flash memory, and may include a plurality of memory blocks. Each memory block, e.g., BLK0, may include a plurality of NAND cell strings, e.g., NS11 to NS33, a plurality of word lines, e.g., WL1 to WL8, a plurality of bit lines, e.g., BL1 to BL3, a plurality of ground selection lines, e.g., GSL1 to GSL3, a plurality of cell string selection lines, e.g., SSL1 to SSL3, and a common source line, e.g., CSL. The number of the NAND cell strings, the number of the word lines, the number of the bit lines, the number of the ground selection lines, and the number of the cell string selection lines may be variously changed according to different example embodiments.

According to FIG. 5, the NAND cell strings NS11, NS21, and NS31 are provided between the first bit line BL1 and the common source line CSL, the NAND cell strings NS12, NS22, and NS32 are provided between the second bit line BL2 and the common source line CSL, and the NAND cell strings NS13, NS23, and NS33 are provided between the third bit line BL3 and the common source line CSL. Each of the NAND cell strings (e.g., NS11) may include a cell string selection transistor SST, a plurality of memory cells, e.g., MC1 to MC8, and a ground selection transistor GST connected in series, but the example embodiments are not limited thereto.

Cell strings connected in common to a single bit line form one column. For example, the cell strings NS11, NS21, and NS31 connected in common to the first bit line BL1 may correspond to a first column, the cell strings NS12, NS22, and NS32 connected in common to the second bit line BL2 may correspond to a second column, and the cell strings NS13, NS23, and NS33 connected in common to the third bit line BL3 may correspond to a third column, etc.

Cell strings connected to one string selection line form one row. For example, the cell strings NS11, NS12, and NS13 connected to the first cell string selection line SSL1 may correspond to a first row, the cell strings NS21, NS22, and NS23 connected to the second cell string selection line SSL2 may correspond to a second row, and the cell strings NS31, NS32, and NS33 connected to the third cell string selection line SSL3 may correspond to a third row, etc.

The cell string selection transistor SST is connected to a corresponding string selection line from among the string selection lines SSL1 to SSL3, respectively. The plurality of memory cells MC1 to MC8 are connected to the corresponding word lines WL1 to WL8, respectively. The ground selection transistor GST is connected to a corresponding ground selection line from among the ground selection lines GSL1 to GSL3. The cell string selection transistor SST is connected to a corresponding bit line from among the bit lines BL1 to BL3, and the ground selection transistor GST is connected to the common source line CSL.

Word lines (e.g., WL1) having the same height are commonly connected to each other. The cell string selection lines, e.g., SSL1 to SSL3, are separated from each other, and the ground selection lines, e.g., GSL1 to GSL3, are also separated from each other. For example, when memory cells connected to the first word line WL1 and belonging to the cell strings NS11, NS12, and NS13 are programmed, the first word line WL1 and the first cell string selection line SSL1 are selected. The ground selection lines GSL1 to GSL3 may be commonly connected to each other. In another example embodiment, the ground selection lines GSL1 to GSL3 may be connected to each other separately.

Figure 6:
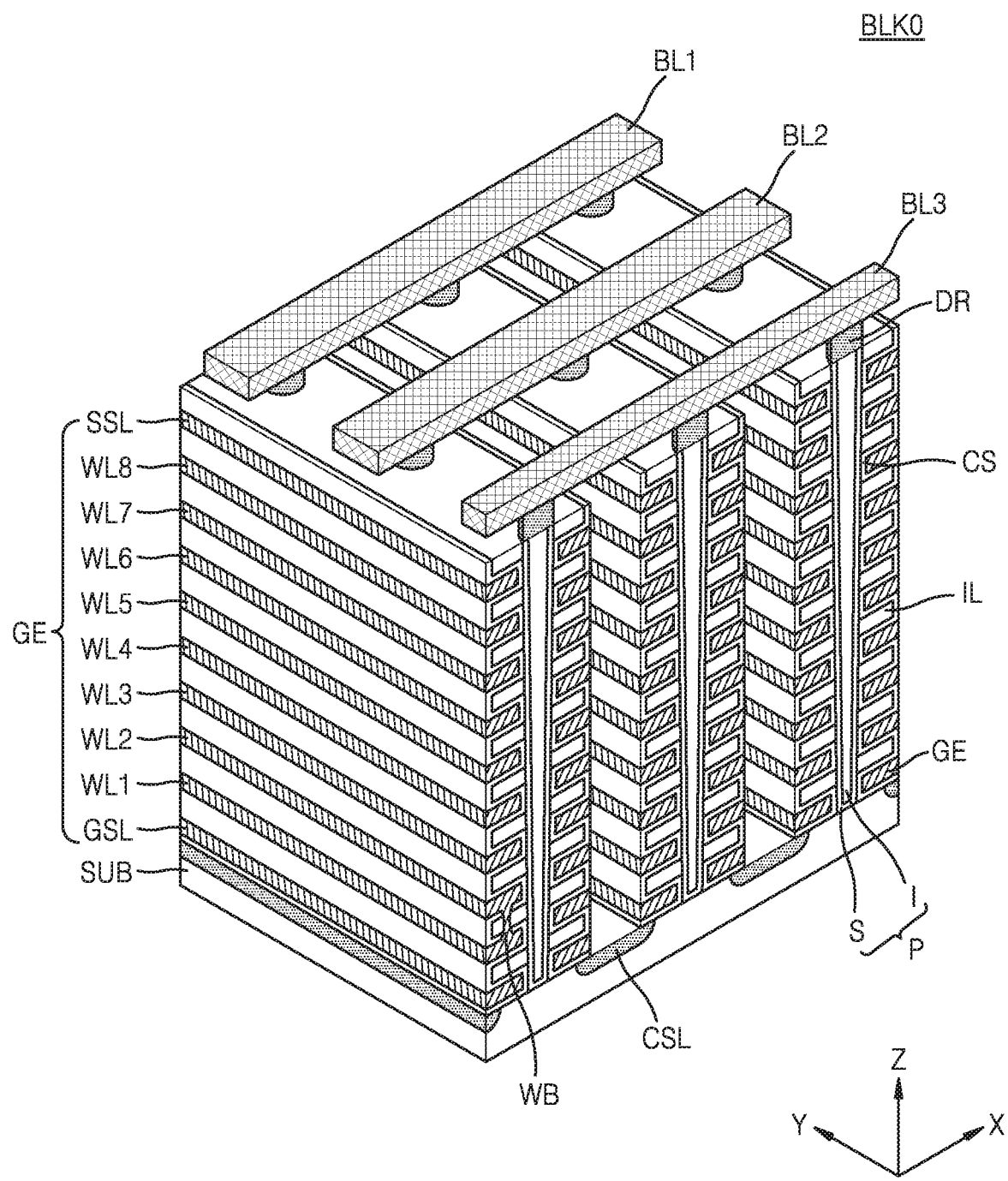
FIG. 6 is a perspective view of the memory block of FIG. 5 according to at least one example embodiment.

FIG. 6 is a perspective view of the memory block BLK0 of FIG. 5 according to at least one example embodiment.

Referring to FIG. 6, each memory block included in BLK0, e.g., the memory cell array 130 (of FIG. 2), is formed in a direction perpendicular to a substrate SUB, however the example embodiments are not limited thereto. Although FIG. 6 shows that the memory block BLK0 includes two of the selection lines GSL and SSL, eight of the word lines WL1 to WL8, and three of the bit lines BL1 to BL3, the memory block BLK0 may include more or less than these lines in practice.

The substrate SUB has a first conductivity type (e.g., a p-type) and extends in a first direction (e.g., a Y-direction), and the common source line CSL doped with impurities of a second conductivity type (e.g., an n-type) is provided. A plurality of insulating layers IL extending along the first direction are sequentially provided along a third direction (e.g., a Z-direction) on regions of the substrate SUB between two adjacent common source lines CSL, and the plurality of insulating layers IL are spaced apart from each other by a specific distance along the third direction. For example, the plurality of insulating layers IL may include an insulating material such as a silicon oxide.

A plurality of pillars P arranged sequentially along the first direction and passing through the plurality of insulating layers IL along the third direction are provided on the region of the substrate SUB between the two adjacent common source lines CSL. For example, the plurality of pillars P may penetrate the plurality of insulating layers IL and contact the substrate SUB. In more detail, a surface layer S of each pillar P may include a first type of silicon material and may function as a channel region. An inner layer I of each pillar P may include an insulating material such as a silicon oxide or an air gap.

In the regions between two adjacent common source lines CSL, a charge storage layer CS is provided along exposed surfaces of the insulating layers IL, the pillars P, and the substrate SUB. The charge storage layer CS may include a gate insulating layer (referred to as a tunneling insulating layer), a charge trap layer, and a blocking insulating layer. For example, the charge storage layer CS may have an oxide-nitride-oxide (ONO) structure, but is not limited thereto. In addition, in the region between the two adjacent common source lines CSL, a gate electrode GE such as the selection lines GSL and SSL and the word lines WL1 to WL8 is formed on an exposed surface of the charge storage layer CS.

Drains and/or drain contacts DR are provided on the plurality of pillars P, respectively. For example, the drains and/or drain contacts DR may include a silicon material doped with impurities of a second conductivity type. The bit lines BL1 to BL3 extending in a second direction (e.g., an X-direction) and spaced apart by a certain distance (e.g., a desired distance) along the first direction are provided on the drains DR.

The surface layer S at the bottom of the plurality of pillars P may be thinned with the increase of the number of the columns. As a result, the surface layer S may not withstand a voltage difference between the plurality of pillars P serving as a channel and the lower word lines (e.g., WL1 to WL3) may be destroyed (e.g., deteriorated, nonfunctional, etc.). If such a phenomenon becomes severe, not only will the surface layer S be destroyed, but the word lines and the insulating layers IL located between the word lines may also be destroyed, and further, a word line bridging phenomenon WB in which the word lines (e.g., WL1 and WL2) are short-circuited may also appear. According to the word line bridging phenomenon WB, an uncorrectable error correcting code (UECC) may occur which causes data loss for the lower word lines. According to at least one example embodiment of the inventive concepts, an output current from a charge pump may increase as a word line is short-circuited, and the occurrence of the UECC may be limited and/or prevented by detecting the output current and setting the memory block as a bad block based thereon.

Figure 7:
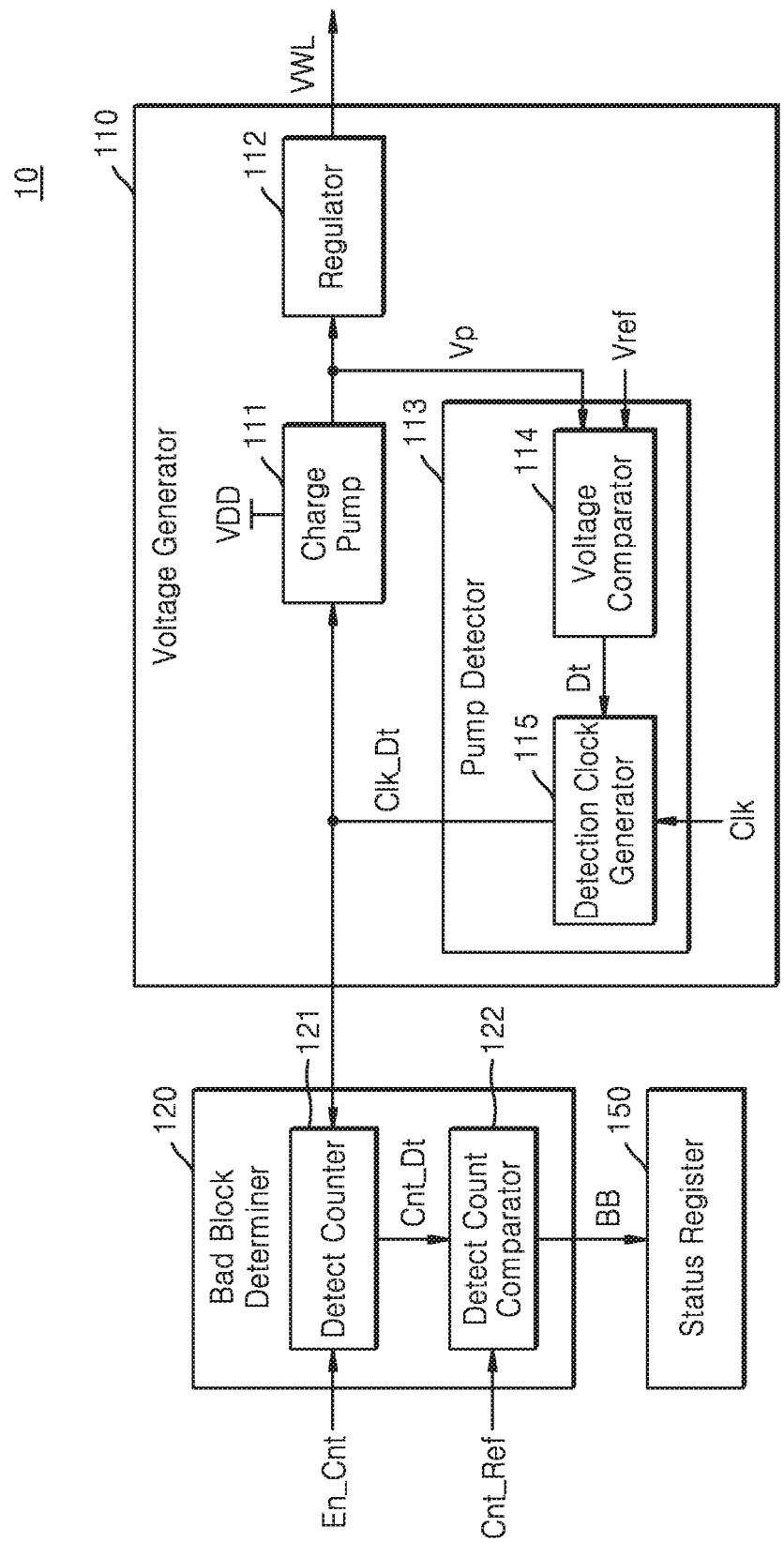
FIG. 7 is a block diagram of a nonvolatile memory device according to at least one example embodiment of the inventive concepts.

FIG. 7 is a block diagram of the nonvolatile memory device 10 according to at least one example embodiment of the inventive concepts. In FIG. 7, the same reference numerals as in FIG. 2 denote the same elements, and therefore, repeated descriptions thereof will not be given herein.

Referring to FIG. 7, the nonvolatile memory device 10 may include the voltage generator 110, the bad block determiner 120, and/or the status register 150, etc., wherein the voltage generator 110 may include the charge pump 111, the regulator 112, and/or the pump detector 113, etc. However, the example embodiments are not limited thereto.

The charge pump 111 may be connected to a power supply voltage VDD, and may generate and output a pump voltage Vp. The regulator 112 may generate the word-line voltage VWL by regulating the pump voltage Vp based on a voltage control signal.

The pump detector 113 may include a voltage comparator 114 and a detection lock generator 115. The voltage comparator 114 may receive the pump voltage Vp and output a detection signal Dt based on the pump voltage Vp and the reference voltage Vref, for example, by comparing the pump voltage Vp with the reference voltage Vref. In at least one example embodiment in which the pump voltage Vp is a negative voltage, the voltage comparator 114 may transition the detection signal Dt to logic high when the pump voltage Vp is greater than the reference voltage Vref having a level less than zero (e.g., in comparison to a desired threshold voltage, in comparison to ground, etc.). In at least one example embodiment in which the pump voltage Vp is a positive voltage, the voltage comparator 114 may transition the detection signal Dt to logic high when the pump voltage Vp is less than the reference voltage Vref having a level greater than zero (e.g., a level greater than a desired threshold voltage, greater than ground, etc.). In at least one example embodiment, the reference voltage Vref may be desired and/or predetermined.

The detection clock generator 115 may generate a detection clock signal Clk_Dt by synchronizing the detection clock signal Clk_Dt with a clock signal Clk. In at least one example embodiment, the detection clock generator 115 may include at least one AND gate, and may generate the detection clock signal Clk_Dt by performing an AND operation of the detection signal Dt and the clock signal Clk. The detection clock generator 115 may output the generated detection clock signal Clk_Dt to the charge pump 111 and the bad block determiner 120. The charge pump 111 may increase the magnitude of a voltage level of the pump voltage Vp corresponding to the detection clock signal Clk_Dt.

The bad block determiner 120 may include a detection counter 121 and a detection count comparator 122. The detection counter 121 may generate a detection count Cnt_Dt by counting the detection count Cnt_Dt during a period in which the count-enable signal En_Cnt is applied. In at least one example embodiment, the control logic circuit 140 may output the count-enable signal En_Cnt to the bad block determiner 120 after a desired and/or predetermined time, and in another example embodiment, may output the count-enable signal En_Cnt to the bad block determiner 120 in a desired and/or predetermined interval. Also, an interval where the word-line voltage VWL is stable may mean that a difference between a target word-line voltage and the current word-line voltage VWL is within a desired and/or predetermined voltage difference.

The detection count comparator 122 may output the bad block setting signal BB by comparing the detection count Cnt_Dt with a reference count Cnt_Ref. In at least one example embodiment, the detection count comparator 122 may output the bad block setting signal BB when the detection count Cnt_Dt is greater than the reference count Cnt_Ref. In at least one example embodiment, the reference count Cnt_Ref may be desired and/or predetermined and may be updated by the control logic circuit 140 and/or the memory controller 20. When the detection count comparator 122 outputs the bad block setting signal BB, the status register 150 may set a memory block corresponding to the bad block setting signal BB as a bad block corresponding thereto.

Figure 8:
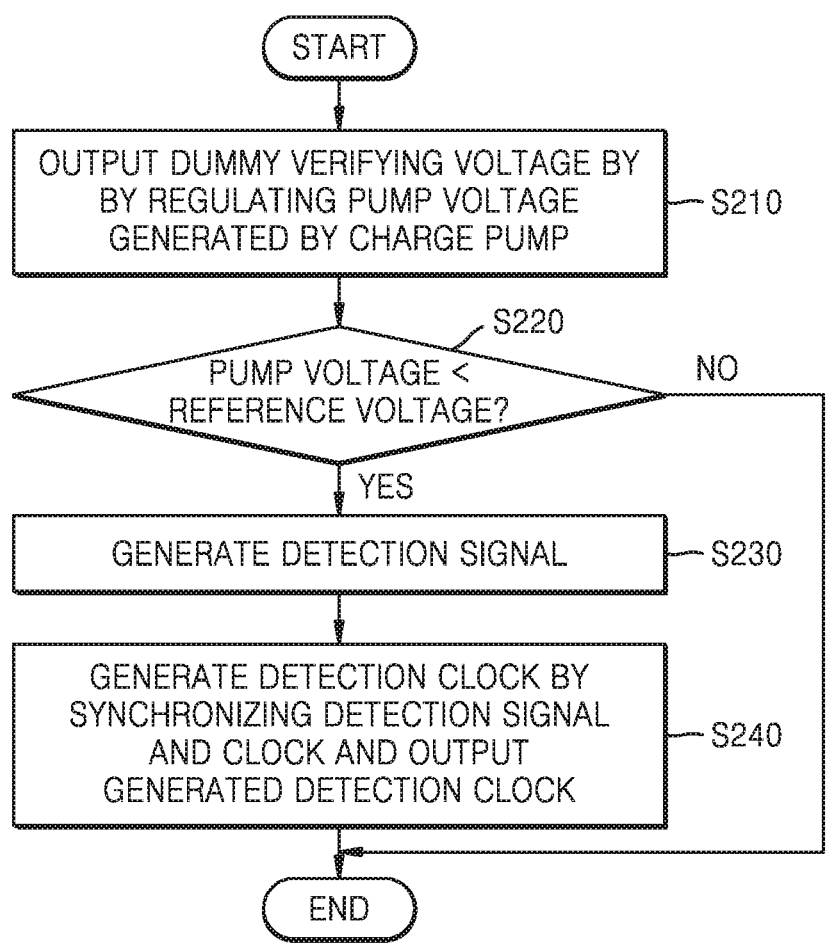
FIG. 8 is a flowchart of an operation of a voltage generator according to at least one example embodiment of the inventive concepts.

FIG. 8 is a flowchart of an operation of the voltage generator 110 according to at least one example embodiment of the inventive concepts.

Referring to FIGS. 7 and 8, in operation S210, the voltage generator 110 may output a dummy verifying voltage by regulating the pump voltage Vp generated by the charge pump 111 after a programming operation is completed. In at least one example embodiment, the pump voltage Vp may be a negative voltage. In operation S220, the voltage generator 110 may compare the magnitude of a voltage level of the pump voltage Vp with the magnitude of a voltage level of the reference voltage Vref. In operation S230, when the magnitude of the voltage level of the pump voltage Vp is greater than the magnitude of the voltage level of the reference voltage Vref, the voltage generator 110 may generate the detection signal Dt. In more detail, in at least one example embodiment in which the pump voltage Vp is a negative voltage, the voltage comparator 114 may generate the detection signal Dt when the pump voltage Vp is greater than the reference voltage Vref having a level less than zero, however the example embodiments are not limited thereto. In more detail, in at least one example embodiment in which the pump voltage Vp is a positive voltage, the voltage generator 110 may generate the detection signal Dt when the pump voltage Vp is less than the reference voltage Vref having a level greater than zero, however the example embodiments are not limited thereto.

In operation S240, the voltage generator 110 may generate the detection clock Clk_Dt by synchronizing the detection signal Dt and the clock signal Clk, and output the generated detection clock Clk_Dt to the bad block determiner 120. When the magnitude of the voltage level of the pump voltage Vp is not less than the magnitude of the voltage level of the reference voltage Vref, the voltage generator 110 may not generate the detection signal Dt.

Figure 9:
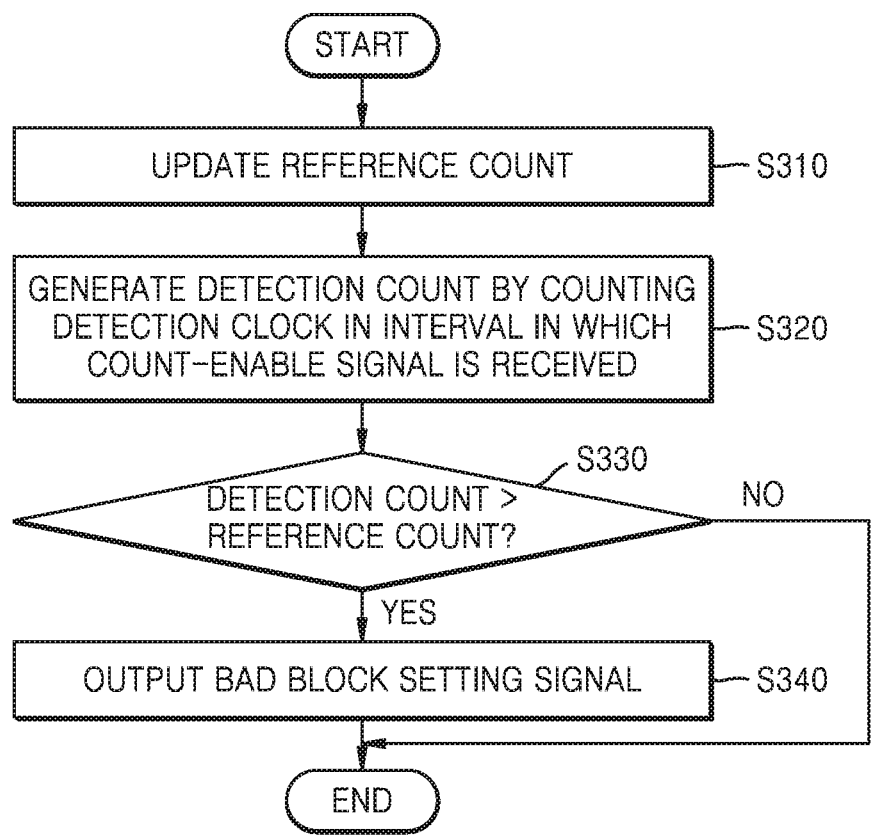
FIG. 9 is a flowchart of an operation of a bad block determiner according to at least one example embodiment of the inventive concepts.

FIG. 9 is a flowchart of an operation of the bad block determiner 120 according to at least one example embodiment of the inventive concepts.

Referring to FIGS. 2 and 9, in operation S310, the bad block determiner 120 may update the reference count Cnt_Ref by receiving the reference count Cnt_Ref from the outside (e.g., the control logic circuit 140, the memory controller 20, and/or any other external source). In operation S320, the bad block determiner 120 may generate the detection count Cnt_Dt by counting the detection clock Clk_Dt in an interval in which the count-enable signal En_Cnt is received. In at least one example embodiment, the count-enable signal En_Cnt may be applied in an interval where the word-line voltage VWL is stable.

In operation S330, the bad block determiner 120 may compare the detection count Cnt_Dt with the reference count Cnt_Ref. In operation S340, when the detection count Cnt_Dt is greater than the reference count Cnt_Ref, the bad block determiner 120 may output the bad block setting signal BB to the status register 150. The status register 150 may set a memory block corresponding to the bad block setting signal BB as a bad block. When the detection count Cnt_Dt is not greater than the reference count Cnt_Ref, the bad block determiner 120 may not output the bad block setting signal BB to the status register 150.

Figure 10:
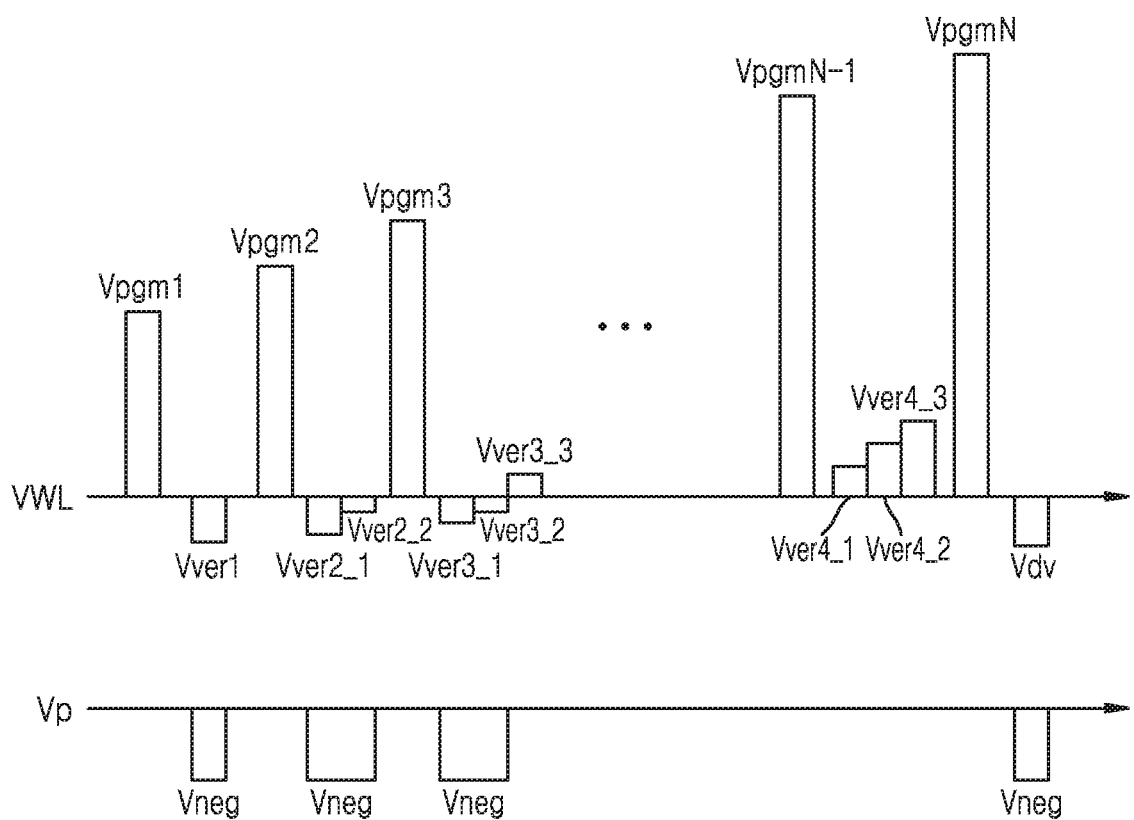
FIG. 10 is a graph of a voltage used in a programming operation according to at least one example embodiment of the inventive concepts.

FIG. 10 is a graph of a voltage applied for a programming operation according to at least one example embodiment of the inventive concepts.

Referring to FIGS. 2 and 10, a vertical axis represents a voltage level of the word-line voltage VWL or the pump voltage Vp, and a horizontal axis represents time. The voltage generator 110 may output N programming voltages Vpgm1 to VpgmN to the word line WL during N programming loops to perform a program and may output a plurality of verifying voltages Vver to the word line WL. The plurality of verifying voltages Vver may be different for each programming loop, and at least one of the plurality of verifying voltages Vver may be a negative voltage.

In an example embodiment represented by FIG. 10, the voltage generator 110 may sequentially output the first programming voltage Vpgm1 and the first verifying voltage Vver1 to the word line WL during the first programming loop, the second programming voltage Vpgm2, the second-1 verifying voltage Vver2_1, and the second-2 verifying voltage Vver2_2 to the word line WL during the second programming loop, and the third programming voltage Vpgm3, the third-1 verifying voltage Vver3_1, the third-2 verifying voltage Vver3_2, and the third-3 verifying voltage Vver3_3 to the word line WL during the third programming loop. In addition, the voltage generator 110 may complete the programming operation by sequentially outputting the fourth-1 verifying voltage Vver4_1, the fourth-2 verifying voltage Vver4_2, and the fourth-3 verifying voltage Vver4_3 to the word line WL during the first programming loop and outputting the $N^{th}$ programming voltage VpgmN to the word line WL during the $N^{th}$ programming loop. According to at least one example embodiment of the inventive concepts, the voltage generator 110 may output a dummy verifying voltage Vdv to the word line WL after the programming operation is completed, and may perform a detecting operation using the same.

In at least one example embodiment, the charge pump 111 may generate the negative pump voltage Vp to generate a verifying voltage having a voltage level less than zero (and/or a desired threshold voltage). The pump voltage Vp may be generated only when generating a verifying voltage having a voltage level less than zero. In the at least one example embodiment of FIG. 10, when the first verifying voltage Vver1, the second-1 verifying voltage Vver2_1, the second-2 verifying voltage Vver2_2, the third-1 verifying voltage Vver3_1, the third-2 verifying voltage Vver3_2, and the dummy verifying voltage Vdv are generated, the pump voltage Vp may be formed at a voltage level of a negative voltage Vneg.

The nonvolatile memory device 10 according to the inventive concepts may perform the detecting operation with respect to the negative voltage Vneg for generating the dummy verifying voltage Vdv. When the pump voltage Vp increases, a voltage difference between memory blocks according to a distance between the voltage generator 110 and each of the memory blocks may increase, too. Since the negative voltage Vneg may have a lower voltage level compared to the pump voltage Vp for generating the programming voltage Vpgm1 to VpgmN, the detecting operation may be performed efficiently despite a distance difference between the voltage generator 110 and the memory blocks. Furthermore, according to at least one example embodiment of the inventive concepts, the charge pump 111, which generates the negative voltage Vneg, may be connected to any one of the plurality of word lines WL. Accordingly, individual control of the detecting operation may be possible.

Figure 11A:
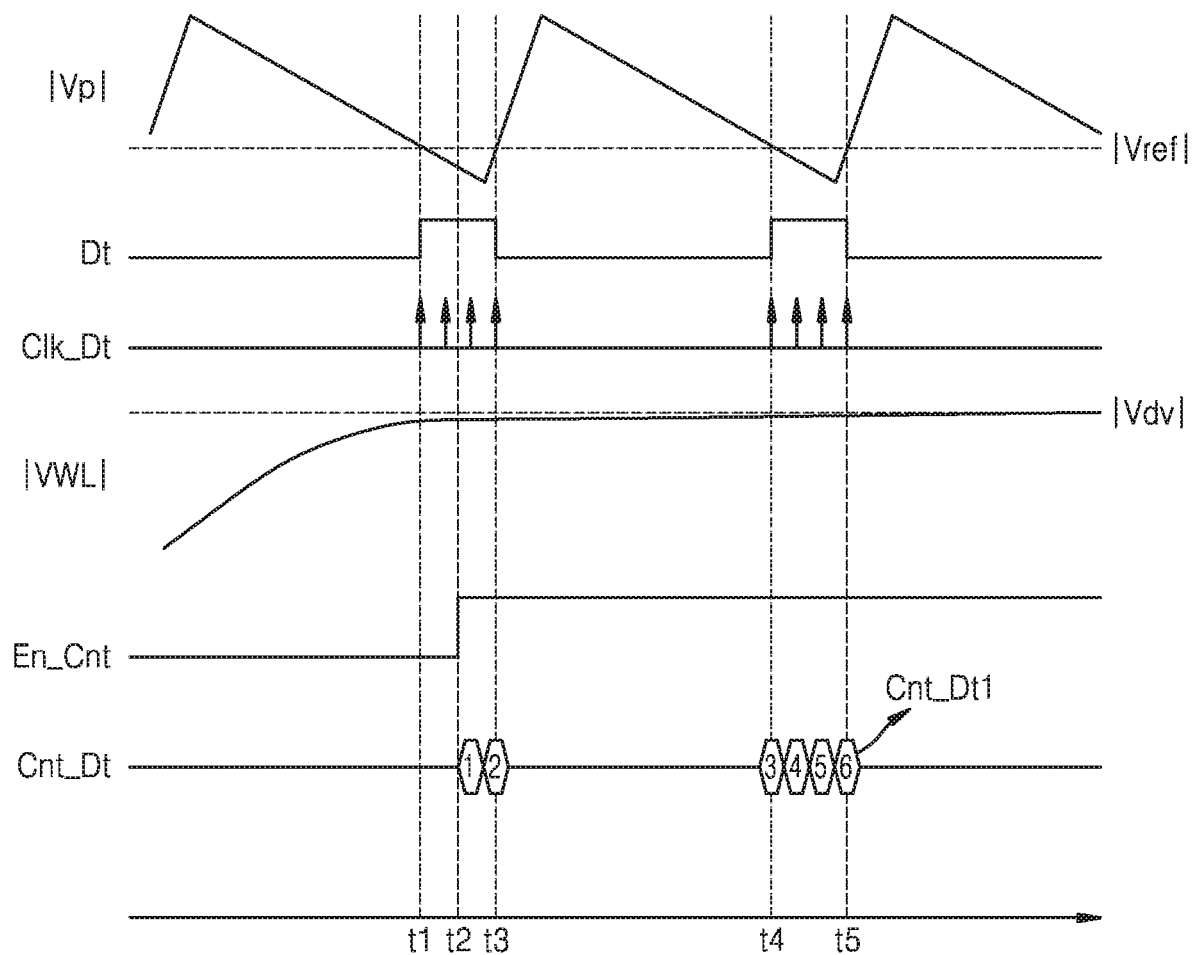
FIGS. 11A and 11B are timing diagrams of operations of a nonvolatile memory device, according to at least one example embodiment of the inventive concepts.
Figure 11B:
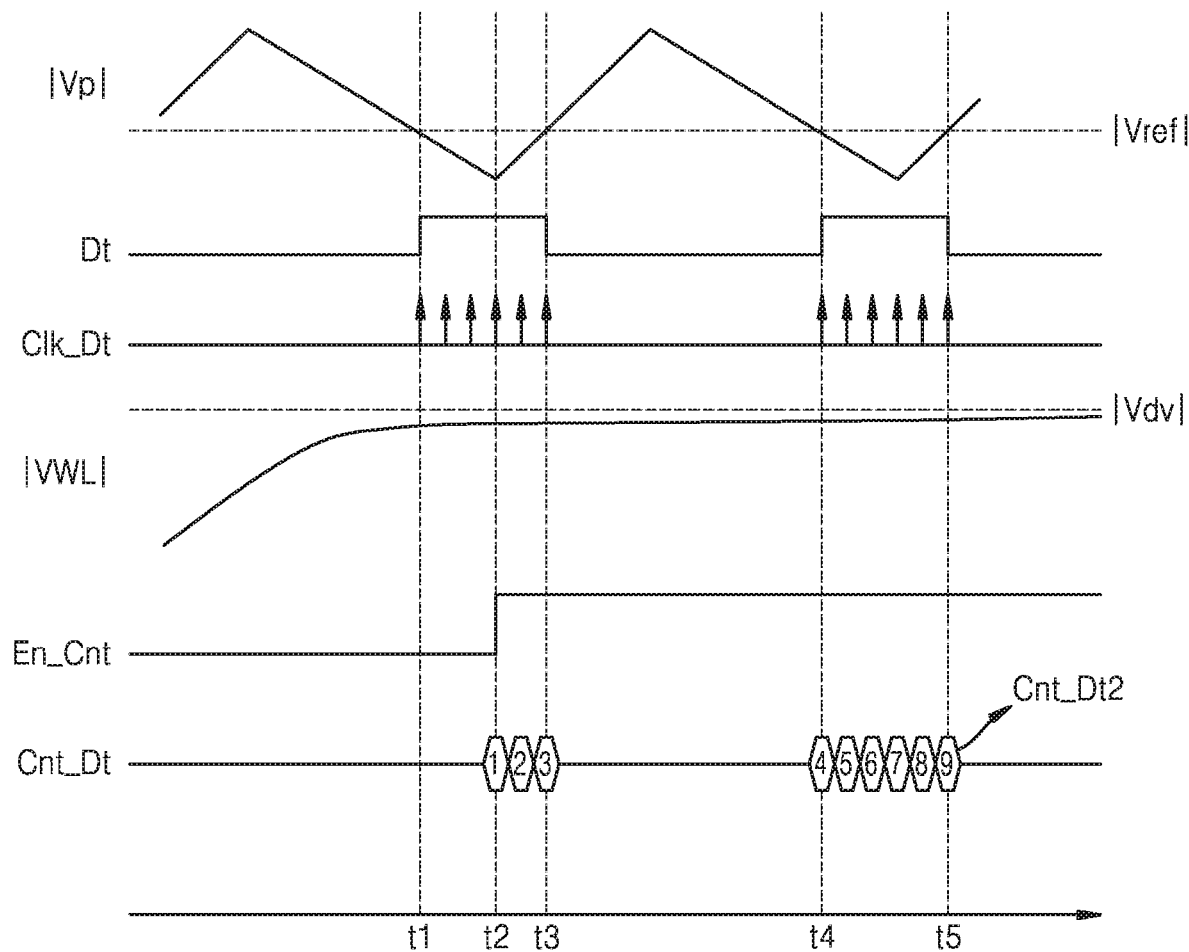

FIGS. 11A and 11B are timing diagrams of operations of a nonvolatile memory device 10, according to at least one example embodiment of the inventive concepts. In more detail, FIG. 11A is a timing diagram of a detecting operation for a memory block in which a word line bridge is not generated, and FIG. 11B is a timing diagram of a detecting operation for a memory block in which a word line bridge is generated.

Referring to FIG. 7, and FIGS. 11A and 11B, the magnitude of the voltage level of the pump voltage Vp may be reduced with a certain slope after reaching a specific voltage level. The pump detector 113 may compare the magnitude of the voltage level of the reference voltage Vref with the magnitude of the voltage level of the pump voltage Vp and may output the detection signal Dt at a logic high level at first to third points in time t1 to t3 and fourth and fifth points in time t4 and t5 when the magnitude of the voltage level of the pump voltage Vp becomes less than the magnitude of the voltage level of the reference voltage Vref. The pump detector 113 may generate the detection clock Clk_Dt by synchronizing the clock Clk and the detection signal Dt and may output the detection clock Clk_Dt to the bad block determiner 120. The bad block determiner 120 may generate the detection clock Clk_Dt by counting the detection clock Clk_Dt corresponding to the count-enable signal En_Cnt received after the second point in time t2 when magnitude of a voltage level of the word-line voltage VWL is stabilized.

In the at least one example embodiment of FIG. 11A, a first detection count Cnt_Dt1 generated by the above-described detecting operation may be '6'. Meanwhile, in the at least one example embodiment of FIG. 11B, since there are many charges that flow into a word line due to a word line bridging phenomenon, the magnitude of the voltage level of the pump voltage Vp may be increased at a slower rate than in the at least one example embodiment of FIG. 11A. As a result, in the at least one example embodiment of FIG. 11B, an interval in which the magnitude of the voltage level of the pump voltage Vp is less than the magnitude of the voltage level of the reference voltage Vref may be longer than that in FIG. 11A. Accordingly, a second detection count Cnt_Dt2 generated as the result may be '9'.

In at least one example embodiment in which the reference count Cnt_Ref is '7', since the bad block determiner 120 may not set a memory block corresponding to the at least one example embodiment of FIG. 11A as a bad block because the first detection count Cnt_Dt1 is not greater than the reference count Cnt_Ref. Meanwhile, since the bad block determiner 120 may set a memory block corresponding to the at least one example embodiment of FIG. 11B as a bad block because the second detection count Cnt_Dt2 is greater than the reference count Cnt_Ref.

Figure 12:
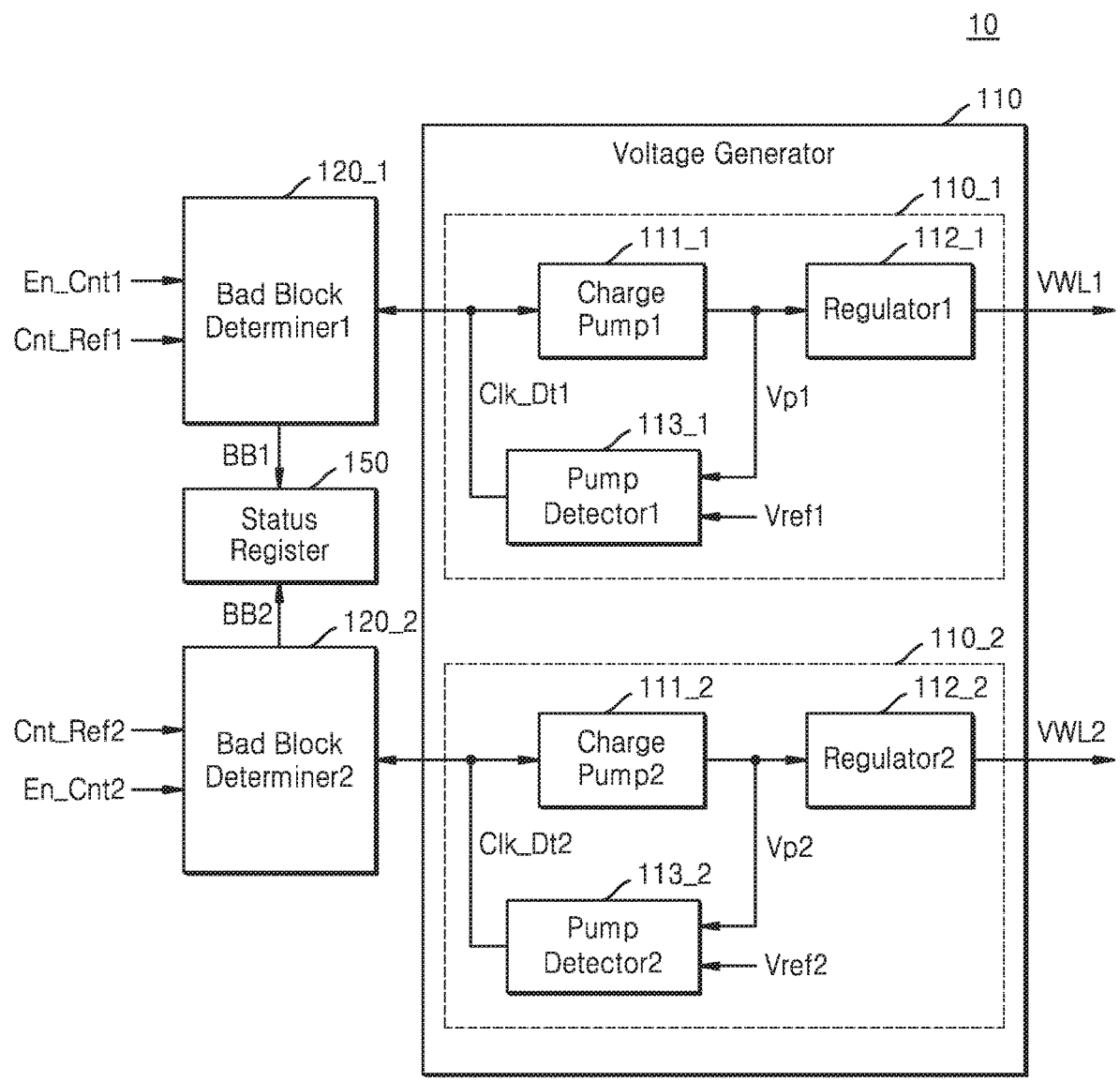
FIG. 12 is a block diagram of a nonvolatile memory device according to at least one example embodiment of the inventive concepts.

FIG. 12 is a block diagram of the nonvolatile memory device 10 according to at least one example embodiment of the inventive concepts. In FIG. 12, the same reference numerals as in FIG. 7 denote the same elements, and therefore, repeated descriptions thereof will not be given herein.

Referring to FIG. 12, the nonvolatile memory device 10 may include the voltage generator 110, a first bad block determiner 120_1, a second bad block determiner 120_2, and/or a status register 150, but is not limited thereto, wherein the voltage generator 110 may include the first voltage generator 110_1 and/or the second voltage generator 110_2, but is not limited thereto. The first voltage generator 110_1 and the second voltage generator 110_2 may generate different word-line voltages VWL1 and VWL2. In at least one example embodiment, the first voltage generator 110_1 may generate a first voltage, such as a negative voltage lower than zero or other threshold voltage, and the second voltage generator 110_2 may generate a second voltage, e.g., a positive voltage greater than zero or other threshold voltage, however the example embodiments are not limited thereto.

The first voltage generator 110_1 may include a first charge pump 111_1, a first regulator 112_1, and/or a first pump detector 113_1, etc. The first charge pump 111_1 may generate a first pump voltage Vp1 having, for example, a level less than zero, and the first regulator 112_1 may regulate the first pump voltage Vp1 to generate the first word-line voltage VWL1. In at least one example embodiment, the first word-line voltage VWL1 may be either a verifying voltage having a voltage level, for example, less than zero or a dummy verifying voltage. The first pump detector 113_1 may generate a first detection clock signal Clk_Dt1 based on the first pump voltage Vp1 and a first reference voltage Vref1 and output the generated first detection clock signal Clk_Dt1 to the first bad block determiner 120_1. The first bad block determiner 120_1 may generate a first detection count based on a first count-enable signal En_Cnt1 and the first detection clock signal Clk_Dt1 and may further generate a first bad block setting signal BB1 based on the first detection count and a first reference count Cnt_Ref1. The first bad block determiner 120_1 may set a corresponding memory block as a bad block by outputting the first bad block setting signal BB1 to the status register 150.

The second voltage generator 110_2 may include a second charge pump 111_2, a second regulator 112_2, and/or a second pump detector 113_2, etc. The second charge pump 111_2 may generate a second pump voltage Vp2 having a level, for example greater than zero and/or a comparison threshold voltage, and the second regulator 112_2 may regulate the second pump voltage Vp2 to generate the second word-line voltage VWL2. In at least one example embodiment, the second word-line voltage VWL2 may be either a programming voltage or a verifying voltage having a voltage level, for example, higher than zero and/or a comparison threshold voltage. The second pump detector 113_2 may generate a second detection clock signal Clk_Dt2 based on the second pump voltage Vp2 and a second reference voltage Vref2, and may output the second detection clock signal Clk_Dt2 to the second bad block determiner 120_2. The second bad block determiner 120_2 may generate a second detection count based on a second count-enable signal En_Cnt2 and the second detection clock signal Clk_Dt2, and may further generate a second bad block setting signal BB2 based on the second detection count and a second reference count Cnt_Ref2. The second bad block determiner 120_2 may set a corresponding memory block as a bad block by outputting the second bad block setting signal BB2 to the status register 150. The first bad block setting signal BB1 and the second bad block setting signal BB2 may be signals for setting an identical memory block as a bad block, or may be signals for setting different memory blocks as bad blocks.

According to at least one example embodiment of the inventive concepts, a detecting operation may be performed based on at least one of the first pump voltage Vp1 having a voltage level less than zero (and/or a comparison threshold voltage) and a second pump voltage Vp2 having a voltage level greater than zero (and/or a comparison threshold voltage). However, the example embodiments are not limited thereto, and for example, the detecting operation may be based on the first pump voltage Vp1 having a voltage level greater than a comparison threshold voltage, or a second pump voltage Vp2 having a voltage level lower than a comparison threshold voltage (or second comparison threshold voltage), etc.

Figure 13:
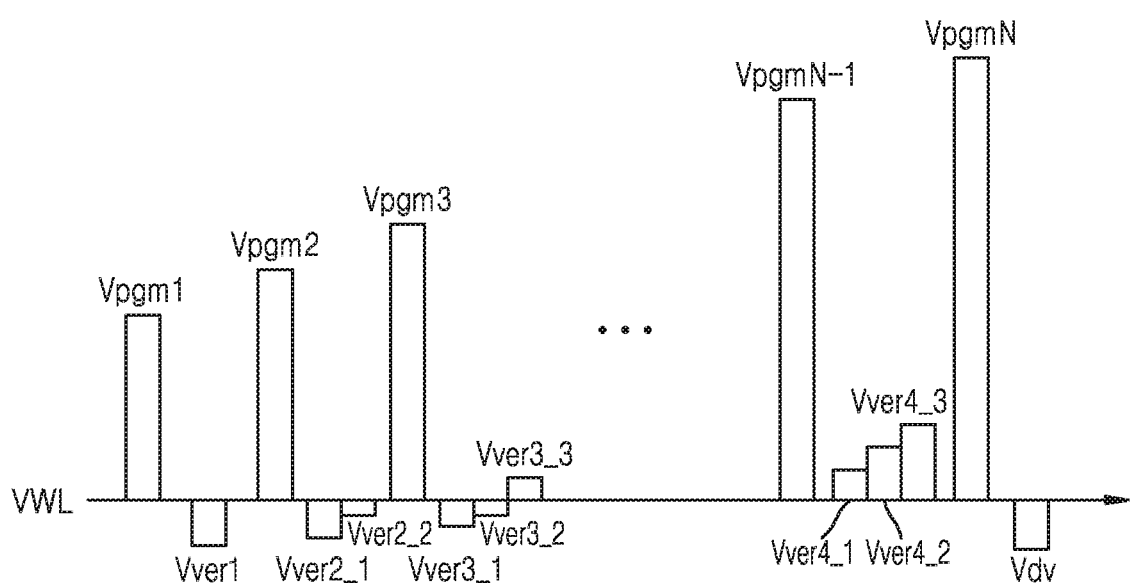
FIG. 13 is a graph of a voltage used in a programming operation according to at least one example embodiment of the inventive concepts.
Figure 13:
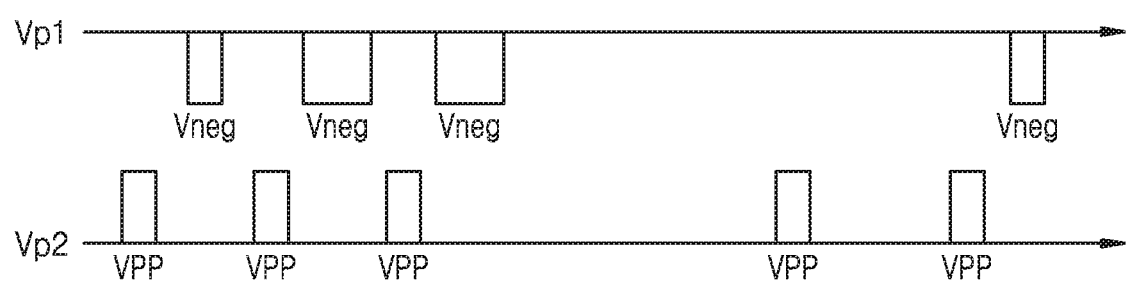

FIG. 13 is a graph of a voltage applied for a programming operation according to at least one example embodiment of the inventive concepts. In FIG. 13, the same reference numerals as in FIG. 10 denote the same elements, and therefore, repeated descriptions thereof will not be given herein.

Referring to FIGS. 12 and 13, a vertical axis represents a voltage level of the word-line voltage VWL or the pump voltage Vp, and a horizontal axis represents time. Since the first pump voltage is already described in FIG. 10, a detailed description thereof will not be given herein.

The nonvolatile memory device 10 may perform a detecting operation based on the second pump voltage Vp2 having a level, for example, greater than zero, output from the second charge pump 111_2 in addition to the first pump voltage Vp1 having a level, for example, less than zero. That is, the nonvolatile memory device 10 may perform the detecting operation using the second pump voltage Vp2 having a voltage level of a supply voltage VPP to generate at least one of the first to $N^{th}$ programming voltages Vpgm1 to VpgmN. In at least one example embodiment, the nonvolatile memory device 10 may skip the second pump voltage Vp2 corresponding to at least some of the first to $N^{th}$ programming voltages Vpgm1 to N without performing the detecting operation. In at least one example embodiment, the detecting operation may be performed on the second pump voltage Vp2 corresponding to the first to the (N−1)$^{th}$ programming voltages Vpgm1 to VpgmN−1, and may not be performed on the second pump voltage Vp2 corresponding to the N$^{th}$ programming voltage VpgmN.

The nonvolatile memory device 10 may apply the dummy verifying voltage Vdv to a word line after the programming operation is completed and may perform the detecting operation with respect to the first pump voltage Vp1 corresponding thereto.

Figure 14:
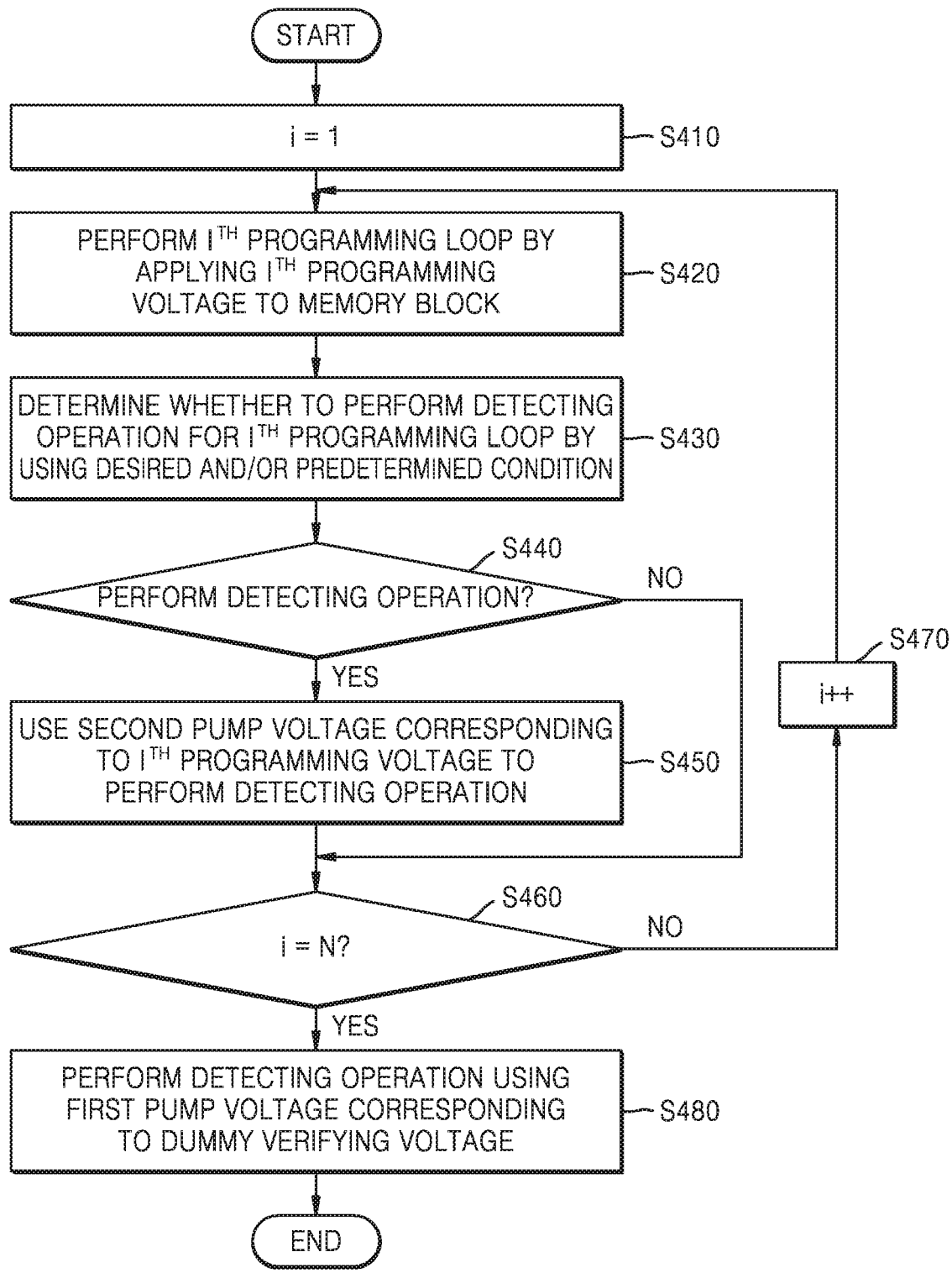
FIG. 14 is a flowchart of an operating method of a nonvolatile memory device, according to at least one example embodiment of the inventive concepts.

FIG. 14 is a flowchart of an operating method of the nonvolatile memory device 10, according to at least one example embodiment of the inventive concepts.

Referring to FIGS. 12 and 14, in operation S410, the nonvolatile memory device 10 may substitute 1 as an initial value for an integer i, and in operation S420, the nonvolatile memory device 10 may execute an i$^{th}$ programming loop by applying an i$^{th}$ programming voltage to a memory block. In operation S430, the nonvolatile memory device 10 may determine whether to perform a detecting operation for the i$^{th}$ programming loop by using a desired and/or predetermined condition.

In at least one example embodiment, the nonvolatile memory device 10 may compare a desired and/or predetermined reference programming voltage with the i$^{th}$ programming voltage, and may perform the detecting operation for the i$^{th}$ programming loop when a voltage level of the i$^{th}$ programming voltage is, for example, lower than that of the reference programming voltage, and may not perform the detecting operation for the i$^{th}$ programming loop when the voltage level of the i$^{th}$ programming voltage is, for example, not lower than that of the reference programming voltage.

In at least one example embodiment, the nonvolatile memory device 10 may compare the integer i with a desired and/or predetermined reference loop count, and may perform the detecting operation for the i$^{th}$ programming loop when the integer i is lower than the desired and/or predetermined reference loop count, and may not perform the detecting operation for the i$^{th}$ programming loop when the integer i is not lower than the desired and/or predetermined reference loop count.

In at least one example embodiment, the nonvolatile memory device 10 may not perform the detecting operation for the i$^{th}$ programming loop when a detaching operation for an (i−1)$^{th}$ programming loop is not performed.

In operation S440, if it is determined to perform the detecting operation based on the above-described desired and/or predetermined condition, in operation S450, the nonvolatile memory device 10 may use the second pump voltage Vp2 corresponding to the i$^{th}$ programming voltage to perform the detecting operation. In operation S440, if it is determined not to perform the detaching operation, the nonvolatile memory device 10 may skip operation S450 without performing the detaching operation.

In operation S460, the nonvolatile memory device 10 may confirm whether the integer i is an integer N, which indicates completion of a programming operation. In operation S470, if the integer i is not the integer N, the nonvolatile memory device 10 may add 1 to the integer i and repeat S420 to S460. In operation S480, if the integer i is the integer N, the nonvolatile memory device 10 may perform the detecting operation using the first pump voltage Vp2 corresponding to a dummy verifying voltage.

Figure 15:
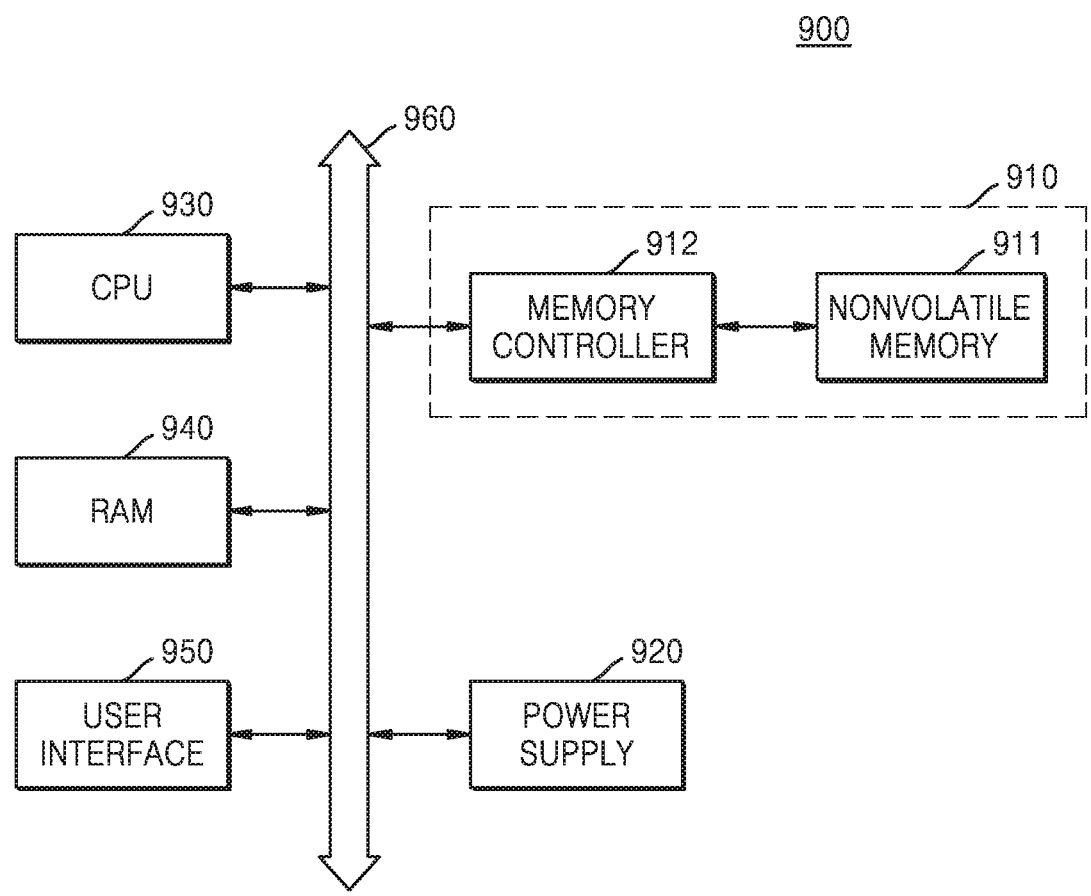
FIG. 15 is a view of a computing system device including a nonvolatile memory device, according to at least one example embodiment of the inventive concepts.

FIG. 15 is a view of a computing system device 900 including a nonvolatile memory device 911, according to at least one example embodiment of the inventive concepts.

Referring to FIG. 15, the computing system device 900 may include at least one microprocessor 930 electrically connected to a bus 960, a user interface 950, and a nonvolatile memory system 910 having a memory controller 912 and the nonvolatile memory device 911, etc., but the example embodiments are not limited thereto. The nonvolatile memory device 911 may store N-bit data processed/to be processed by the microprocessor 930 (N is an integer equal to 1 or greater) through the memory controller 912. In addition, the nonvolatile memory device 911 may also include the nonvolatile memory device described in FIGS. 1 to 14. That is, the nonvolatile memory device 911 may predict an UECC of a memory cell array by applying a dummy verifying voltage and performing a detecting operation for the dummy verifying voltage. The computing system device 900 may further include random-access memory (RAM) 940 and/or a power supply 920, etc.

If the computing system device 900 is a mobile device, a battery for supplying an operating voltage of a computing system and a modem such as a baseband chipset may be additionally provided. Furthermore, it is to be understood by those of ordinary skilled in the art that the computing system device 900 may also be provided with an application chipset, a camera image processor (CIS), a mobile DRAM, and the like, and therefore, detailed descriptions thereof will not be given herein.

The memory controller 912 and the nonvolatile memory device 911 may include, e.g., a Solid State Drive/Disk (SSD) using a nonvolatile memory for storing data.

Example embodiments have been illustrated and described in the drawings and the detailed description as described above. Although the specific terms are used to explain these example embodiments in the present disclosure, the specific terms are not intended to restrict the scope of the inventive concepts and are only used for a better understanding of the inventive concepts. It will be understood by those of ordinary skill in the art that various changes in form and details may be made without departing from the spirit and scope of the invention as defined by the appended claims. Therefore, the scope of the inventive concepts is defined not by the detailed description of the inventive concepts but by the appended claims.

What is claimed is:

1. An operating method of a nonvolatile memory device for programming a first memory block from among a plurality of memory blocks, the operating method comprising:

programming, using a control logic circuit, a first word line connected to the first memory block by sequentially executing first to N$^{th}$ (N is a natural number) programming loops on the first memory block;

applying, using the control logic circuit, a dummy verifying voltage generated by regulating a first pump voltage of a first charge pump to the first word line;

generating, using the control logic circuit, a first detection count based on the first pump voltage and a first reference voltage; and outputting, using the control logic circuit, a bad block setting signal for setting the first memory block as a bad block based on the first detection count and a first reference count.

2. The operating method of claim 1, wherein the first pump voltage is a negative voltage.

3. The operating method of claim 1, wherein
the first memory block includes a plurality of word lines, the plurality of word lines including the first word line; and the first charge pump is connected to the first word line and is not connected to remaining word lines of the plurality of word lines of the first memory block.

4. The operating method of claim 1, wherein the outputting comprises outputting the bad block setting signal when the first detection count is greater than the first reference count.

5. The operating method of claim 1, further comprising:
updating, using the control logic circuit, bad block information corresponding to the first memory block to indicate that the first memory block is a bad block in response to the bad block setting signal.

6. The operating method of claim 1, further comprising:
updating, using the control logic circuit, the first reference count based on reference count information.

7. The operating method of claim 1, wherein
the first reference voltage and the first pump voltage have a voltage level less than a zero; and
the generating of the first detection count comprises counting a number of clock intervals during a first period in which the first pump voltage has a voltage level higher than a voltage level of the first reference voltage, wherein a level of the dummy verifying voltage does not fluctuate in the first period.

8. The operating method of claim 1, wherein the programming comprises:
applying a programming voltage to the first word line by regulating a second pump voltage of a second charge pump; and
generating a second detection count based on the second pump voltage and a second reference voltage.

9. The operating method of claim 8, further comprising:
outputting, using the control logic circuit, a bad block setting signal for setting the first memory block as a bad block based on the second detection count and a second reference count.

10. The operating method of claim 8, wherein the generating of the second detection count comprises:
determining whether to perform the generating of the second detection count corresponding to a $M^{th}$ (M is a natural number of 1 to N) programming loop; and
generating the second detection count based on the second pump voltage corresponding to the $M^{th}$ programming loop and the second reference voltage, the generating the second detection count based on results of the determining whether to perform the generating of the second detection count.

11. The operating method of claim 10, wherein the determining of whether to perform the generating of the second detection count comprises determining whether a voltage level of a programming voltage corresponding to the $M^{th}$ programming loop is less than a reference programming voltage.

12. The operating method of claim 10, wherein the determining of whether to perform the generating of the second detection count is based on whether the natural number M is less than a reference loop count.

13. The operating method of claim 10, wherein the determining of whether to perform the generating of the second detection count comprises determining not to perform generating of a second detection count of a $M^{th}+1$ programming loop when the second detection count is greater than a second reference count.

14. A nonvolatile memory device comprising:
a memory cell array including a first memory block connected to a plurality of word lines; and
control logic circuitry configured to, output a voltage generated by regulating a first pump voltage to a first word line as a dummy verifying voltage after completing a programming operation for the first word line, the plurality of word lines including the first word line,
generate a first detection clock based on the first pump voltage and a first reference voltage; and
output a bad block setting signal for setting the first memory block as a bad block based on the first detection clock and a first reference detection count.

15. The nonvolatile memory device of claim 14, wherein the control logic circuitry is further configured to:
generate a first detection signal in an interval in which the first pump voltage has a voltage level higher than that of the first reference voltage; and
generate the first detection clock by synchronizing the first detection signal with a clock signal.

16. The nonvolatile memory device of claim 15, wherein the control logic circuitry is further configured to:
generate a first detection count by counting a number of clocks in a first period of the first detection clock; and
generate the bad block setting signal based on the first detection count and the first reference detection count,
wherein a voltage level of the dummy verifying voltage does not fluctuate in the first period.

17. The nonvolatile memory device of claim 14, further comprising:
a status register configured to receive the bad block setting signal and update a bad block state for the first memory block based on the bad block setting signal.

18. The nonvolatile memory device of claim 14, the control logic circuitry is further configured to:
output a programming voltage to the first word line by regulating a second pump voltage for a programming operation for the first word line;
generate a second detection clock based on the second pump voltage and a second reference voltage; and
output the bad block setting signal for setting the first memory block as a bad block based on the second detection clock and a second reference detection count.

19. The nonvolatile memory device of claim 18, wherein
the programming operation includes a plurality of programming loops; and
the control logic circuitry is configured not to output the bad block setting signal regardless of the second detection clock with respect to the second detection clock corresponding to at least some of the plurality of programming loops.

20. An operating method of a nonvolatile memory device for programming a first memory block from among a plurality of memory blocks, the operating method comprising:
programming, using a control logic circuit, a first word line connected to the first memory block by sequentially executing first to $N^{th}$ (N is a natural number) programming loops;
applying, using the control logic circuit, a first voltage generated by regulating a first pump voltage having a voltage level less than zero of a charge pump to the first word line after the programming is completed;
generating, using the control logic circuit, a first detection count based on the first pump voltage and a first reference voltage; and
setting, using the control logic circuit, the first memory block as a bad block based on the first detection count and a first reference count, wherein the first detection count is proportional to an amount of charges flowing into the first word line.

\* \* \* \* \*